(12) United States Patent
Fuechsle et al.

(10) Patent No.: US 10,229,365 B2
(45) Date of Patent: Mar. 12, 2019

(54) APPARATUS AND METHOD FOR QUANTUM PROCESSING

(71) Applicants: NewSouth Innovations Pty Limited, Sydney, NSW (AU); University of Melbourne, Parkville, Victoria (AU)

(72) Inventors: Martin Fuechsle, Maroubra (AU); Samuel James Hile, St Peters (AU); Charles David Hill, Point Cook (AU); Lloyd Christopher Leonard Hollenberg, Parkville (AU); Matthew Gregory House, Randwick (AU); Eldad Peretz, Maroubra (AU); Sven Rogge, Stanwell Park (AU); Michelle Yvonne Simmons, Woollahra (AU)

(73) Assignees: NewSouth Innovations Pty Limited, Sydney (AU); University of Melbourne, Parkville (AU)

( * ) Notice: Subject to any disclaimer, the term of this patent is extended or adjusted under 35 U.S.C. 154(b) by 411 days.

(21) Appl. No.: 14/931,768

(22) Filed: Nov. 3, 2015

(65) Prior Publication Data

US 2016/0125311 A1    May 5, 2016

(30) Foreign Application Priority Data

Nov. 3, 2014 (AU) ................................ 2014904417
Feb. 17, 2015 (AU) ................................ 2015900532

(51) Int. Cl.
*G06N 99/00* (2010.01)
*H01L 39/02* (2006.01)
*H01L 27/18* (2006.01)

(52) U.S. Cl.
CPC .......... *G06N 99/002* (2013.01); *H01L 27/18* (2013.01); *H01L 39/02* (2013.01)

(58) Field of Classification Search
CPC ..................................................... G06N 99/002
See application file for complete search history.

(56) References Cited

U.S. PATENT DOCUMENTS 6,369,404 B1    4/2002  Kane
9,858,531 B1 *  1/2018  Monroe ............... G06N 99/002
(Continued)

OTHER PUBLICATIONS

Morton, John J. L. et al., "Solid state quantum memory using the 31P nuclear spin", Jun. 30, 2008.
(Continued)

*Primary Examiner* — Benjamin Sandvik
(74) *Attorney, Agent, or Firm* — Knobbe Martens Olson & Bear LLP

(57) ABSTRACT

The present disclosure provides a quantum processor realized in a semiconductor material and method to operate the quantum processor to implement error corrected quantum computation. The quantum processor comprises a plurality of qubit elements disposed in a two-dimensional matrix arrangement. The qubits are implemented using the nuclear or electron spin of phosphorus donor atoms. Further, the processor comprises a control structure with a plurality of control members, each arranged to control a plurality of qubits disposed along a line or a column of the matrix. The control structure is controllable to perform topological quantum error corrected computation.

16 Claims, 16 Drawing Sheets

(56) References Cited

U.S. PATENT DOCUMENTS

| | | | | |
|---|---|---|---|---|
| 2008/0185576 A1* | 8/2008 | Hollenberg | ............ | B82Y 10/00 |
| | | | | 257/14 |
| 2011/0060780 A1* | 3/2011 | Berkley | ................ | B82Y 10/00 |
| | | | | 708/207 |
| 2014/0354326 A1* | 12/2014 | Bonderson | ........... | G06N 99/002 |
| | | | | 326/5 |
| 2014/0365843 A1* | 12/2014 | Ashikhmin | ............. | G06F 11/10 |
| | | | | 714/758 |

OTHER PUBLICATIONS

McKibbin, S. R. et al, "Paper; Epitaxial top-gated atomic-scale silicon wire in a three-dimensional architecture", Nov. 28, 2012.
Kane, B.E., "A silicon-based nuclear spin on quantum computer", Nature, May 14, 1998, vol. 393, pp. 133-137, Macmillan Publishers Ltd.
Fowler, Austin G. et al., "Surface codes: towards practical large-scale quantum computation" Oct. 26, 2012.
European Search Report dated Jan. 20, 2017 corresponding to European Application No. EP 15192761.3.
European Office Action dated Mar. 14, 2018 corresponding to European Application No. EP 15192761.3.

\* cited by examiner

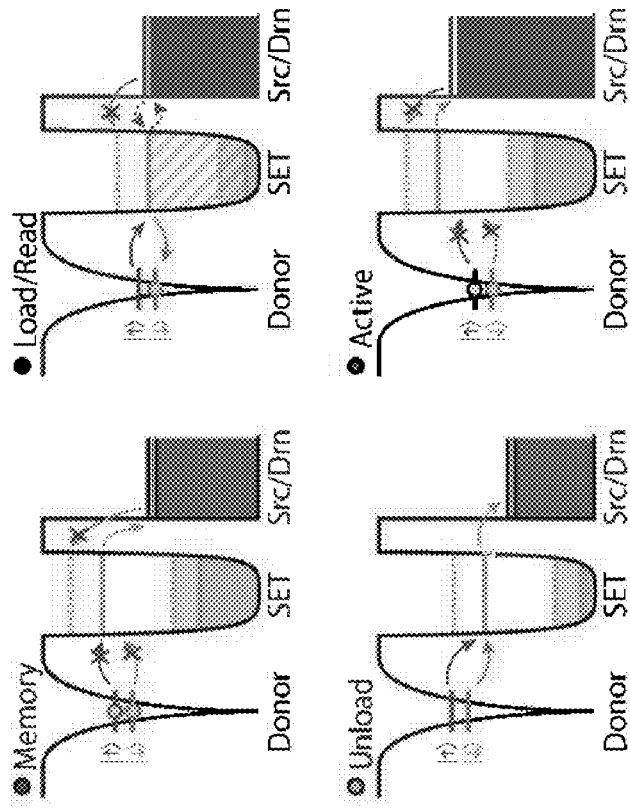
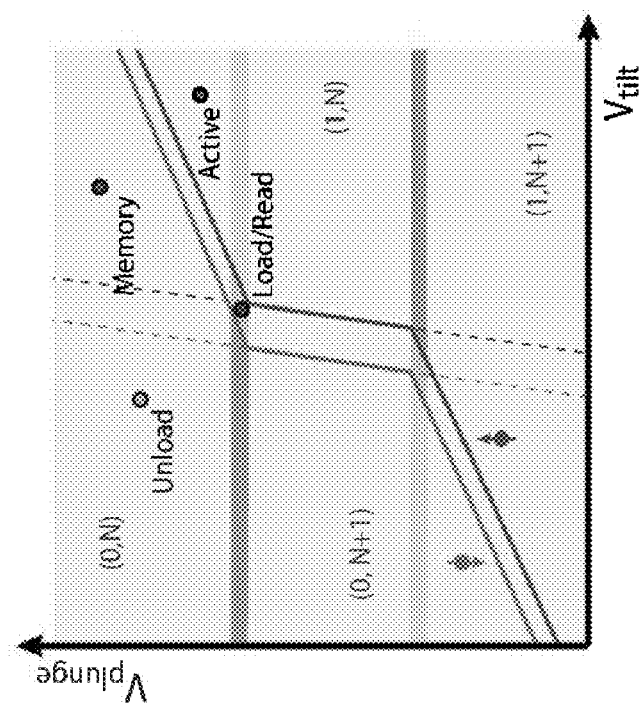
FIGURE 7(a)
FIGURE 7(b)

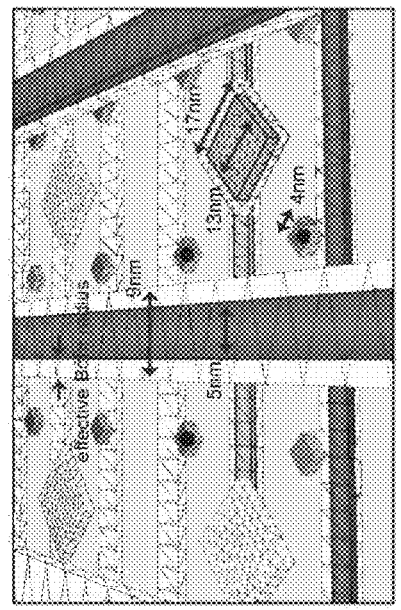
FIGURE 14 (a)
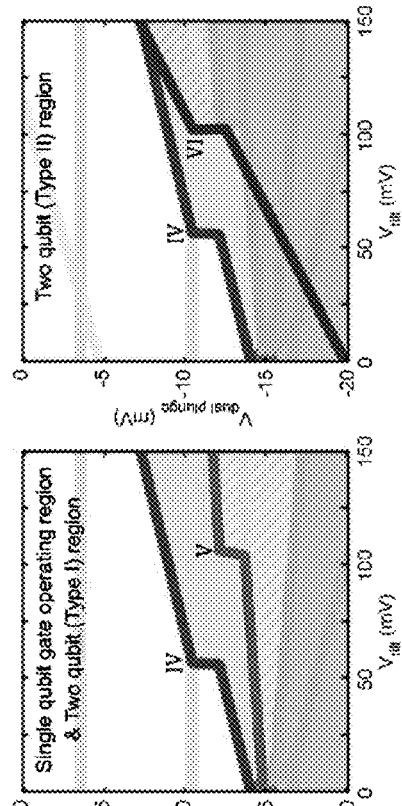
FIGURE 14 (b)
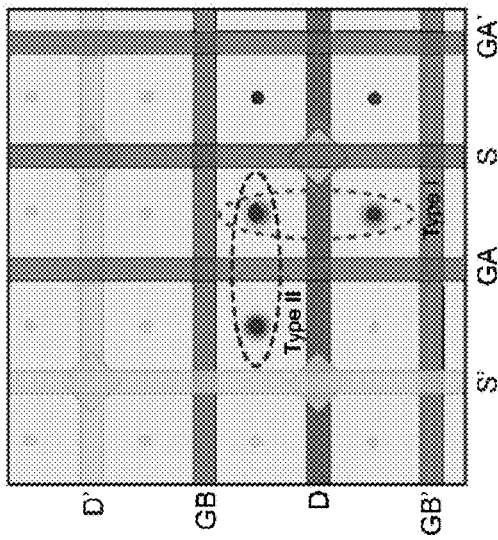
FIGURE 14 (c)
FIGURE 14 (d)
FIGURE 14 (e)

APPARATUS AND METHOD FOR QUANTUM PROCESSING

FIELD OF THE INVENTION

The described technology relates to an advanced processing apparatus and methods to operate the same, particularly, but not exclusively, the described technology relates to a quantum processing apparatus which is controllable to perform error corrected quantum computation.

BACKGROUND OF THE INVENTION

The power and capacity of computing components such as microprocessors and memory circuits has been increasing for the last 50 years, as the size of the functional units, such as transistors, has been decreasing. This trend is now reaching a limit, however, as it is difficult to make the current functional units (such as MOSFETs) any smaller without affecting their operation.

Developments are ongoing to implement new types of processing apparatus that can implement more powerful computations than current processors, using different approaches. For example, quantum processors are being developed which can perform computations according to the rules of quantum mechanics. Approaches to quantum processors have been developed and described in a number of earlier patents, including U.S. Pat. No. 6,472,681 (Kane), U.S. Pat. No. 6,369,404 (Kane), U.S. Pat. No. 7,732,804 (Hollenberg et al) and U.S. Pat. No. 7,547,648 (Ruess et al.). The disclosure of each of these documents is incorporated herein by reference. Such advanced quantum processor promise computational paradigms beyond current devices.

There is a need in the art for a quantum processor architecture design which is feasibly scalable and capable of implementing error corrected quantum computation.

SUMMARY OF THE INVENTION

In accordance with the first aspect, the described technology provides a quantum processor comprising:
  a plurality of qubit elements disposed in a two-dimensional matrix arrangement, and
  a control structure comprising a plurality of control members, each control member being arranged to control a plurality of qubits disposed along a line or a column of the two-dimensional matrix;
  wherein the control structure is controllable to perform topological quantum error corrected computation.

In embodiments, the control structure is controllable to simultaneously interact with a plurality of qubit elements disposed in pattern of qubits.

The quantum state of the qubit elements may be encoded in the nuclear spin of one or more donor atoms embedded in a semiconducting lattice structure, such as phosphorus donor atoms in a $^{28}Si$ crystalline silicon lattice. In some embodiments, a portion of atoms forming the lattice are bonded by strained atomic bonds with at least 2% strain to mitigate the variation of the strength of the exchange-interaction.

In embodiments, the control structure is controllable to simultaneously load or unload electrons to or from a plurality of donor atoms. A plurality of donor atoms may be arranged to facilitate electromagnetic coupling between one or more of the qubit elements.

In embodiments, each control member is disposed between two rows of donor atoms on a plane above or below a plane comprising the donor atoms.

In embodiments, the plurality of control members comprises a first set of elongated control members, disposed in a first plane above the plane comprising the donor atoms, and a second set of elongated control members, disposed in a second plane below the plane comprising the donor atoms. The donor atoms may be arranged in a manner such that donor electron and donor nuclear spins can be rotated simultaneously using a global magnetic field.

In some embodiments, the control members of the first set are parallel to each other and the control members of the second set are parallel to each other; and the control members of the first set are disposed transversally to the control members of the second set to form a plurality of intersections where control members of different sets overlap in the direction perpendicular to the plane comprising the donor atoms.

The control structure may further comprise a plurality of control elements disposed on a plane between the first and the second planes about the intersections, each control element forming a single electron transistor with a respective control member of the first set and a second control member of the second set. Each single electron transistor may be arranged to interact with a plurality of neighbouring donor atoms. The interaction may comprise, for example, loading or unloading of an electron to or from one or more donor atoms or control of the spin orientation of the electron or nucleus of one or more donor atoms.

In embodiments, each single electron transistor is arranged to interact with four donor atoms and the single electron transistor and the four donor atoms form a unit cell of the quantum processor.

In accordance with the second aspect, the described technology provides a method for loading or unloading an electron to or from a donor atom of a quantum processor in accordance with the first aspect comprising the step of switching, for a predetermined number of times, one or more electrostatic signals applied to respective control members from a first configuration to a second configuration, wherein the first configuration of signals is such to prevent quantum tunneling of the electron to or from the donor atom and the second configuration of signals is such to permit quantum tunneling of the electron to or from the donor atom.

In some embodiments, the predetermined number of times is selected such that quantum tunneling of the electron occurs with a predetermined level of confidence.

The one or more electrostatic signals may be maintained in the first configuration for a first period of time and in the second configuration for a second period of time. The first period of time may be shorter than the second period of time. The first period of time may be between 0.1 ns and 0.5 ns.

In some embodiments, the second period of time is selected in a manner such that the nuclear spin of the donor atom undergoes a relative phase shift of $2\pi$ or multiples thereof. The second period of time may be between 8 ns and 40 ns.

In embodiments, the control element is provided in proximity of the donor atom to form a potential well about the donor atom, the potential well providing a plurality of energy levels and the energy spacing of the energy levels being such to allow quantum tunneling of electrons with different spins between the donor atom and the potential well.

In accordance with the third aspect, the described technology provides a method of operating a quantum rotation which may be a X rotation, in an architecture in accordance with the first aspect, the method comprising the steps of:

applying a magnetic field to the donor atom with a loaded electron, the magnetic field being in resonance with the nuclear spin of the donor atom;

allowing coherent rotation of the nuclear spin by an angle θ;

removing the magnetic field.

In some embodiments, the angle θ is equal to π.

In embodiments, the method of the third aspect further comprises the steps of:

loading an electron on the donor atom;
performing a quantum rotation;
unloading the electron from the donor atom; and
measuring the spins state of the electron during the step of unloading the electron.

In some embodiments, the step of measuring the spin state of the electron includes the step of verifying the spin orientation of the electron to detect possible errors of the X rotation.

In accordance with the fourth aspect, the described technology provides a method of operating a quantum processor in accordance with the first aspect comprising the steps of selecting a plurality of donor atoms and operating a quantum rotation on the selected donor atoms using a method in accordance with the third aspect.

The steps of loading an electron onto a donor atom or unloading the electron from the donor atom may be performed using a method in accordance with the second aspect.

In accordance with the fifth aspect, the described technology provides a method of operating a CNOT quantum gate in an architecture in accordance with the first aspect, the method comprising the steps of:

loading a first electron with a predefined spin orientation onto a first donor atom;
performing an X rotation operation on the spin of the first electron;
applying a Hadamard gate to the nuclear spin of the first donor atom;
loading a second electron onto a second donor atom, the second electron having the same spin orientation of the first electron before the X gate is performed on the first electron;
swapping the nuclear spin states of the first and second donor atoms with the respective electron spin states;
allowing interaction of the electron spin states;
swapping the electron spin states of the first and second donor atoms with the respective nuclear spin states;
applying a Hadamard gate to the nuclear spins of the first donor atom; and
unloading the first and second electrons.

In some embodiments, a decoupling pulse is applied over the duration of the loading of the second electron;

In embodiments, during the step of allowing interaction of the electron spin states, a global electron spin echo or other refocusing sequence is applied to the electron spin states.

The step of allowing interaction of the electron spin states may be performed to allow for sufficient interaction between the spin states such that a collective phase flip of π is acquired by the electron spin states.

In some embodiments, during the step of unloading the first and the second electrons, the spins state of the first and the second electrons are measured and the spin orientation of the first and the second electrons are verified to detect possible errors of the CNOT gate.

In some embodiments, control voltages are applied to the second set of control members to prevent unwanted tunneling of electrons.

In some embodiments, control signals are applied to the control structure to correct for variations in donor pairs interaction strength.

In accordance with the sixth aspect, the described technology provides a method of operating a quantum processor in accordance with the first aspect comprising the steps of selecting a plurality of donor atoms and operating a plurality of quantum CNOT gates in accordance with the fifth aspect on the selected donor atoms.

In accordance with the seventh aspect, the described technology comprises a semiconductor quantum processor comprising:

a plurality of donor atoms arranged in a two-dimensional matrix;
a plurality of data qubit elements encoded in a first set of the donor atoms;
a plurality of ancilla qubit elements encoded in a second set of the donor atoms;
wherein in each row or column of the matrix data qubits are alternated with ancilla qubits to facilitate quantum correction; and
a plurality of logical data qubits and logical ancilla qubits are encoded across the matrix, each logical data qubit and logical ancilla qubit being encoded on a plurality of data qubit elements and ancilla qubit elements qubit elements.

In accordance with the eighth aspect, the described technology provides, a method for implementing topological quantum error corrected computation in a quantum processor in accordance with the first or seventh aspect wherein a plurality of data qubit elements are encoded in a first set of the donor atoms and a plurality of ancilla qubit elements are encoded in a second set of the donor atoms;
wherein in each row or column of the matrix data qubits are alternated with ancilla qubits to facilitate quantum correction; and the control method comprises the steps of:

loading an electron onto an ancilla donor atom;
loading an electron onto a data donor atom disposed north of the ancilla donor atom;
performing a CNOT gate between the ancilla and data donor atom to the north;
unloading the electron to the north;
loading an electron onto a data donor atom disposed west of the ancilla donor atom;
performing a CNOT gate between the ancilla and data donor atom to the west;
unloading the electron to the west;
loading an electron onto a data donor atom disposed east of the ancilla donor atom;
performing a CNOT gate between the ancilla and data donor atom to the east;
unloading the electron to the east;
loading an electron onto a data donor atom disposed south of the ancilla donor atom;
performing a CNOT gate between the ancilla and data donor atom to the south; and
unloading the electron to the south;
performing a readout of the ancilla qubit; and
wherein the steps of loading electrons on ancilla/data donor atoms are performed simultaneously on a plurality of donor atoms across the two-dimensional matrix.

In some embodiments, the ancilla qubits facilitate the measurement of X and Z-stabilisers for quantum correction. The control method may further comprise the steps of, after loading an electron onto an ancilla donor atom, performing a first quantum rotation on the ancilla qubit depending on the type of stabiliser measurement (X or Z) to be carried out for error correction and, after unloading the electron to the south, performing a second quantum rotation on the ancilla qubit depending on the type of stabiliser measurement (X or Z) to be carried out for error correction.

In accordance with the ninth aspect, the described technology provides a method for implementing topological quantum error corrected computation in a quantum processor in accordance with the first or seventh aspect comprising the steps of:
   alternately performing a method in accordance with the eighth aspect on two different sets of the logical data qubits; or
   performing a method in accordance with claim the eighth aspect on an array of the logical data qubits.

In accordance with the tenth aspect, the described technology provides a method of operating a Y quantum gate in an architecture in accordance with the first aspect comprising the steps of:
   loading an electron onto a donor atom;
   applying a magnetic field to the donor atom in resonance with nuclear spin of the donor atom and out of phase by an angle of $\pi/2$;
   allowing coherent rotation of the nuclear spin by an angle $\theta=\pi$;
   removing the magnetic field; and
   unloading the electron from the donor atom.

In accordance with the eleventh aspect, the described technology provides a method of operating a Z quantum gate in an architecture in accordance with the first aspect comprising the steps of:
   loading an electron onto a donor atom;
   applying a magnetic field to the donor atom in resonance with nuclear spin of the donor atom;
   allowing coherent rotation of the nuclear spin around a y axis by an angle $\theta=\pi/2$; and
   allowing coherent rotation of the nuclear spin around a x axis by an angle $\theta=\pi$;
   allowing coherent rotation of the nuclear spin around a y axis by an angle $\theta=-\pi/2$.

In some embodiments, at least one of the steps of loading or unloading electrons is performed using a method in accordance with the second aspect.

In embodiments, each step of loading an electron onto an ancilla/data donor atom includes the step of applying control voltages to the first set or the second set of control members to allow tunneling of the electron, the first set of control members comprising control members adjacent the ancilla/data donor atom.

In accordance with the twelfth aspect, the described technology provides a method of performing readout of a quantum state of a plurality of qubit elements in an architecture in accordance with the first aspect, the method comprising the steps of:
   simultaneously controlling a plurality of control members arranged to interact with donor atoms associated with the plurality of qubit elements;
   measuring electrical signals propagated on the plurality of control members; and
   performing one or more time-correlation operations using one or more of the measured electrical signals to determine associate readout information to qubit elements allowing for simultaneous readout.

In accordance with the thirteenth aspect, the described technology provides a method for loading or unloading an electron to or from a donor atom of a quantum processor comprising the step of switching, for a predetermined number of times, one or more electrostatic signals applied to a control member from a first configuration to a second configuration, wherein the first configuration of signals is such to prevent quantum tunneling of the electron to or from the donor atom and the second configuration of signals is such to permit quantum tunneling of the electron to or from the donor atom.

The method of the thirteenth aspect is not limited to the quantum processor architecture described herein and could be used in other types of architectures or devices where an electron has to be loaded or unloaded to or from a donor atom.

In accordance with the fourteenth aspect, the described technology provides a method of manufacturing an advanced processing apparatus comprising the steps of:
   forming a plurality of processing elements on a surface of the substrate;
   forming a plurality of conductive regions on a surface of a substrate;
   depositing a first layer of a first material on the surface of the substrate, the first material having the same crystallographic structure of the substrate;
   forming a plurality of processing elements on the surface of the first layer;
   forming a plurality of conductive regions about the surface of the first layer, each conductive region being located in proximity of a respective processing element;
   depositing a second layer of the first material on the surface of the first layer;
   forming a plurality of processing elements on a surface of the second layer;
   forming a plurality of conductive regions on a surface of the second layer.

Advantageous embodiments of the quantum processor described herein provide a 2D architecture for phosphorus in silicon based quantum computation, which satisfies the stringent parallel and synchronous requirements of topological quantum error correction (TQEC). The architecture exploits natural and highly uniform aspects of the atomic donor system to avoid the need for quantum state engineering and quantum interconnects, and minimizes quantum control and characterization complexity.

In advantageous embodiments, all quantum operations are reduced to highly parallelisable local electron loading/unloading operations with global NMR/ESR control. The 'shared control' of the qubits provided by the architecture allows an overall number of control lines which scales as the square root of the number of qubits.

Surface code repetitions of operations between data and ancilla qubits form the basis of stabiliser measurements in well-defined geometrical patterns across the matrix. Advantageously, in the architecture described herein factors such as $^{28}$Si purity and magnetic field homogeneity can be controlled to a high degree, the donor spin qubits are highly uniform in terms of their energy levels, electron confinement potential, spin-spin interactions, and response to externally applied ('global') spin-control fields. Advantages of the architecture described herein include a high degree of shared control. The architecture takes advantage of controlling the TQEC primitives using multiplexed control lines. In addition, the architecture described herein allows to avoid electron wave-function engineering and quantum interconnects.

The complexity of all quantum operations is distilled to the operation of loading and unloading electrons to and from donor atoms.

Advantageously, embodiments of the quantum processor provide an architecture which is scalable and provides a high degree of parallelism that requires only four steps to perform surface code stabiliser measurements across the entire matrix, independent of the number of qubits.

The architecture allows performing the operations required in surface code syndrome extraction and high-level error corrected logical operations with operational errors falling below the appropriate surface code threshold.

In some variations of the processor each ancilla and data qubit may be encoded in a donor site which comprises a plurality of donor atoms arranged in a cluster. The qubit in this case could be encoded using combinations of quantum properties of the donor atoms in the cluster.

BRIEF DESCRIPTION OF THE DRAWINGS

Features and advantages of the described technology will become apparent from the following description of embodiments thereof, by way of example only, with reference to the accompanying drawings, in which;

FIGS. 7(a) and 7(b) are schematic illustrations of a signal and a simplified quantum structure suitable for loading/unloading;

FIGS. 14(a), 14(b), 14(c), 14(d) and 14(e) show simulation results of electrostatic gate control for qubit addressing;

DETAILED DESCRIPTION OF EMBODIMENTS

Figure 1:
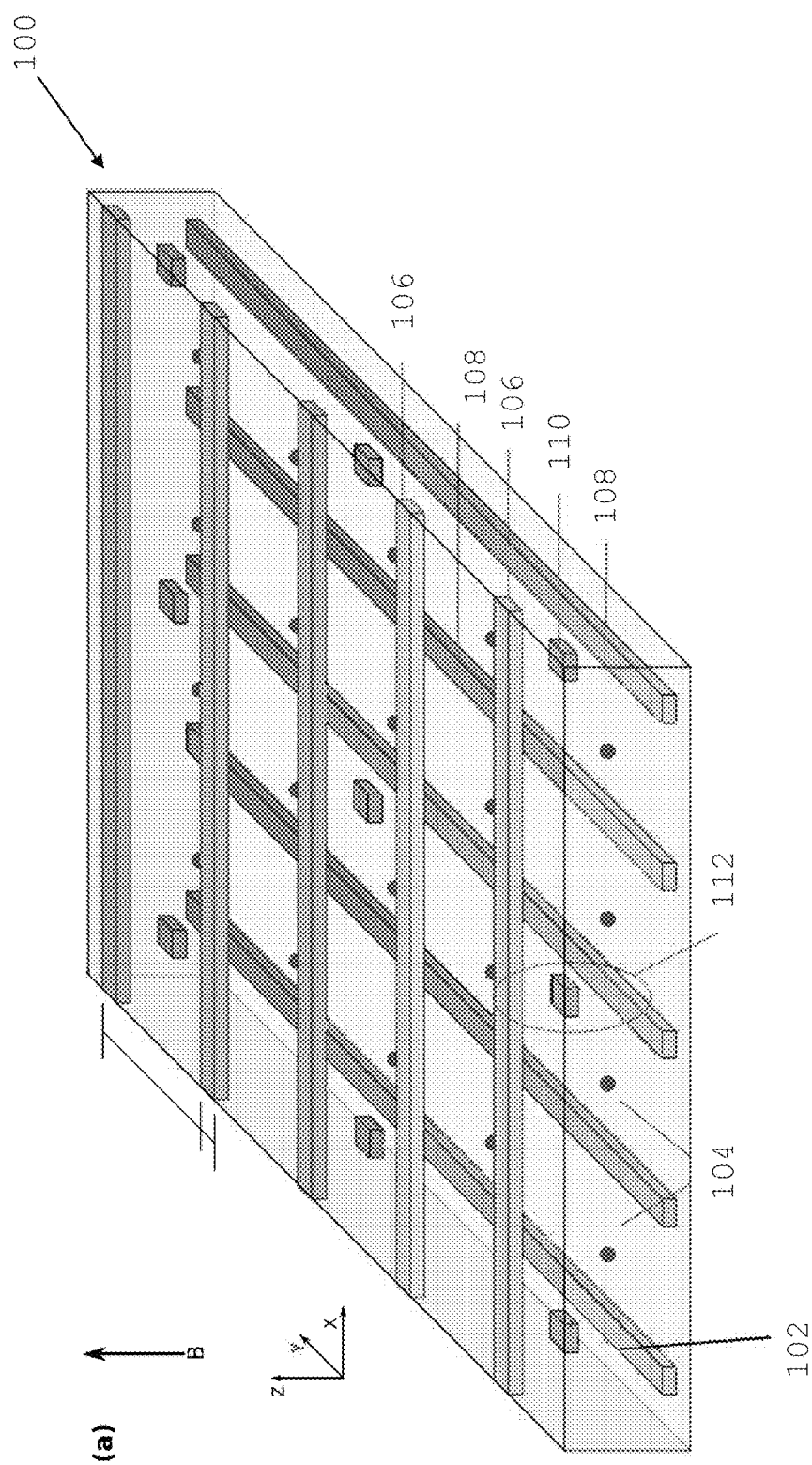
FIGS. 1, 2 and 3 are schematic representations of an architecture of a quantum processor in accordance with embodiments.

Embodiments of the described technology relate to a quantum processor for implementing error corrected quantum computation. In particular, embodiments relate to a quantum computing architecture realised in a semiconductor lattice and methods for controlling the architecture to implement topological quantum error corrected (TQEC) quantum computation.

A plurality of donor atoms are disposed in a two dimensional matrix arrangement in silicon. In some variations of the quantum processor qubits may be encoded in donor sites which comprises a plurality of donor atoms arranged in a cluster. The qubit in this case is encoded using combinations of quantum properties of the donor atoms in the cluster.

Data qubit elements are encoded in a first set of the plurality of donor atoms and the remaining donor atoms are arranged to facilitate quantum error correction. The qubits encoded on the second set of donor atoms are also referred herein as 'ancilla' qubits.

Data and ancilla qubits are encoded in the nuclear spin of respective donor atoms. Donor electron and nuclear spins can be rotated simultaneously using a global magnetic field which can be externally applied to the entire architecture. This provides a substantial advantage in respect to architectures which require local (to each qubit) application of the magnetic field.

A control structure is arranged in the silicon to interact with the data qubits and the ancilla qubits. The arrangement of the control structure allows controlling a plurality of qubits simultaneously. In particular the qubits can be controlled simultaneously in patterns distributed across the matrix. The structure can be controlled to load or unload an electron to or from each of the donor atoms and simultaneously on multiple donor atoms.

A number of different structures, materials, architectures and methods of operation may be used to implement quantum computing. An attractive way of fabricating quantum bits, for example, is to use the nuclear spin of ionized phosphorus donors in silicon as it offers near perfect two-state qubit encoding thanks to the stability of the $^{31}$P nucleus. Quantum control and measurement of ensemble and individual donor nuclear spins verify extremely long quantum coherence times. In addition, donor-based devices can be fabricated using Scanning Tunneling Microscopy (STM) techniques with near atomic precision.

A full-scale universal quantum computer processor will have to comprise hundreds of thousands, preferably millions of qubits. The architecture of a universal quantum processor requires complex characterization to a high level of precision and the capability of implementing quantum error correction (QEC) protocols.

Possible quantum processor architectures suitable for implementing quantum computing have been proposed in the art. However, these architectures are designed to tackle the control and interaction of a few qubits and do not address the stringent requirements of a large and scalable quantum processor capable of implementing error corrected quantum computing over potentially millions of qubits. For example, if separate control lines were required to address each individual qubit in a planar quantum computing architecture, the cost in terms of space required for control lines would scale as O(n), where n is the number of qubits.

Referring now to FIG. 1, there is shown an implementation of a silicon quantum computing architecture 100. The structure is formed in a isotopically purified silicon 28 ($^{28}$Si) substrate 102. A plurality of phosphorus atoms 104 are embedded in the silicon lattice, which in some cases may have strained bonds with at least 2% strain.

Strain mitigates the variation of the strength of the exchange-interaction caused by interference between the six degenerate valley states and allows the reduction of the hyperfine interaction.

Two sets of control members, provided in the form of elongated control lines 108 and 106 extend across the architecture. Control lines 106 are disposed on a plane above the plane comprising the donor atoms and control lines 108 are disposed on a plane below the plane comprising the donor atoms. Control lines 106 and 108 are arranged perpendicularly, with respect to each other, in a criss-cross configuration. In some implementations the control lines may intersect at an angle different from 90°. The control lines 106 and 108 do not physically intersect, however they define intersection points where they pass across two vertically aligned portions of the lattice. About some of these intersections control elements, provided in the form of a heavily doped silicon island 110, are formed. Each island forms a single electron transistor (SET) 112 with respective control members disposed above and below the island. A pair of these control members acts as source and drain of the transistor, and another pair act as transistor gates.

Figure 2:
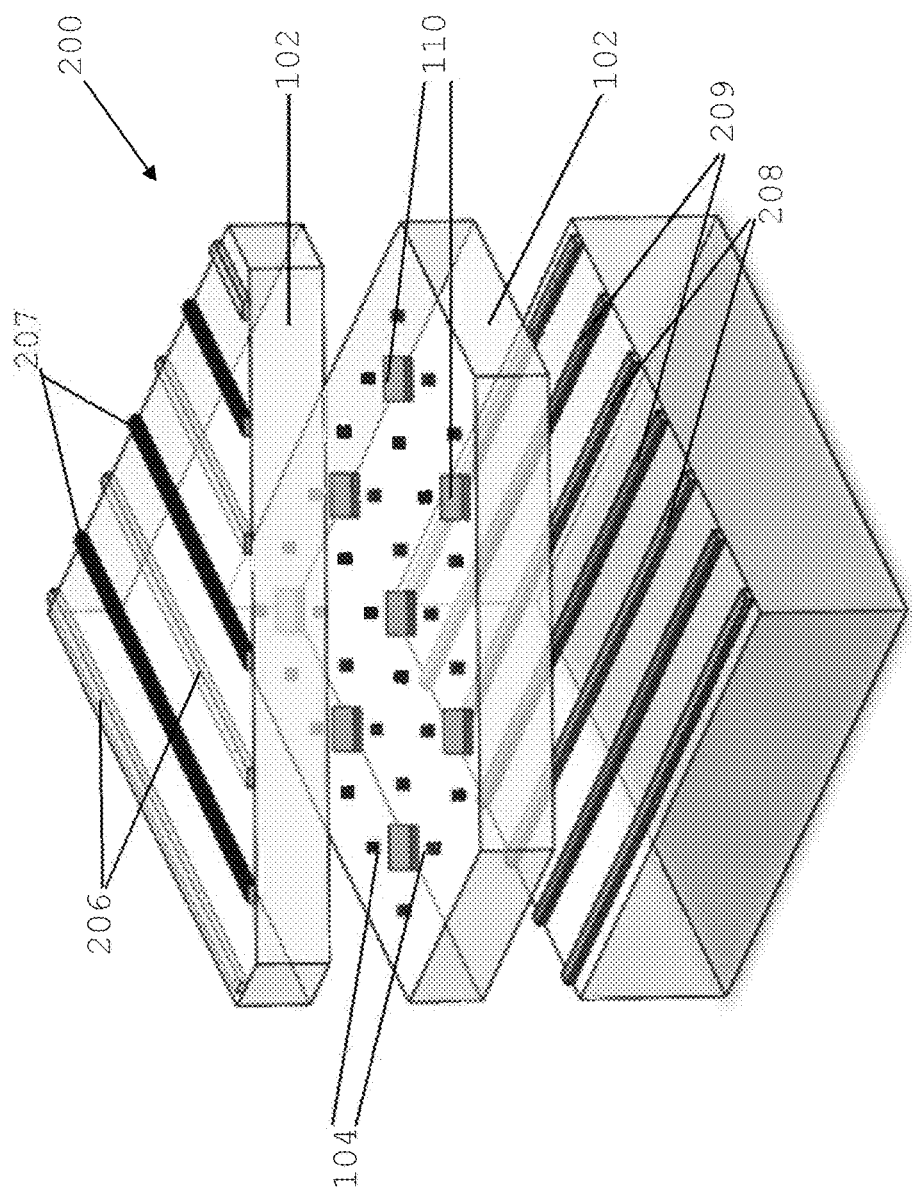

Referring now to FIG. 2, there is shown an exploded representation 200 of the structure of FIG. 1. Structure 200 is exploded in three different silicon planes. A possible technique to manufacture the structure is to start from a pure silicon wafer and fabricate the structures on each plane exploiting the lithographic capabilities of a scanning tunneling microscope together with silicon epitaxy. In operation the entire device is cooled to the mK regime, operates in a magnetic field of approximately B=2T with an externally applied (global) RF and MW control.

In structure 200 the control lines on the bottom plane are separated in two interleaved groups 209 and 208. Control lines 209 act as drains of the SETs and control lines 208 act as gates of the SETs 112. A similar configuration is shown for the control lines on the top plane 207 and 206, which act respectively as sources and gates of the SETs. Each SET 112 interacts with one or more donor atoms 104 through the respective control island 110. In the embodiment described, each island 110 is configured to interact with four donor atoms 104 to form a unitary cell of the architecture. SETs 112 can be controlled, by applying electrical signals to control lines 206 to 209, to load or unload electrons on each donor atom 104 in the architecture or control the spin orientation of an electron or nucleus of one or more donor atoms. Furthermore, the configuration of the donor atoms 104 and the control lines allows for loading or unloading of electrons on multiple donor atoms arranged in predetermined patterns simultaneously. For example, electrons could be loaded onto a plurality donor atoms disposed on a quadrangular pattern.

Figure 3:
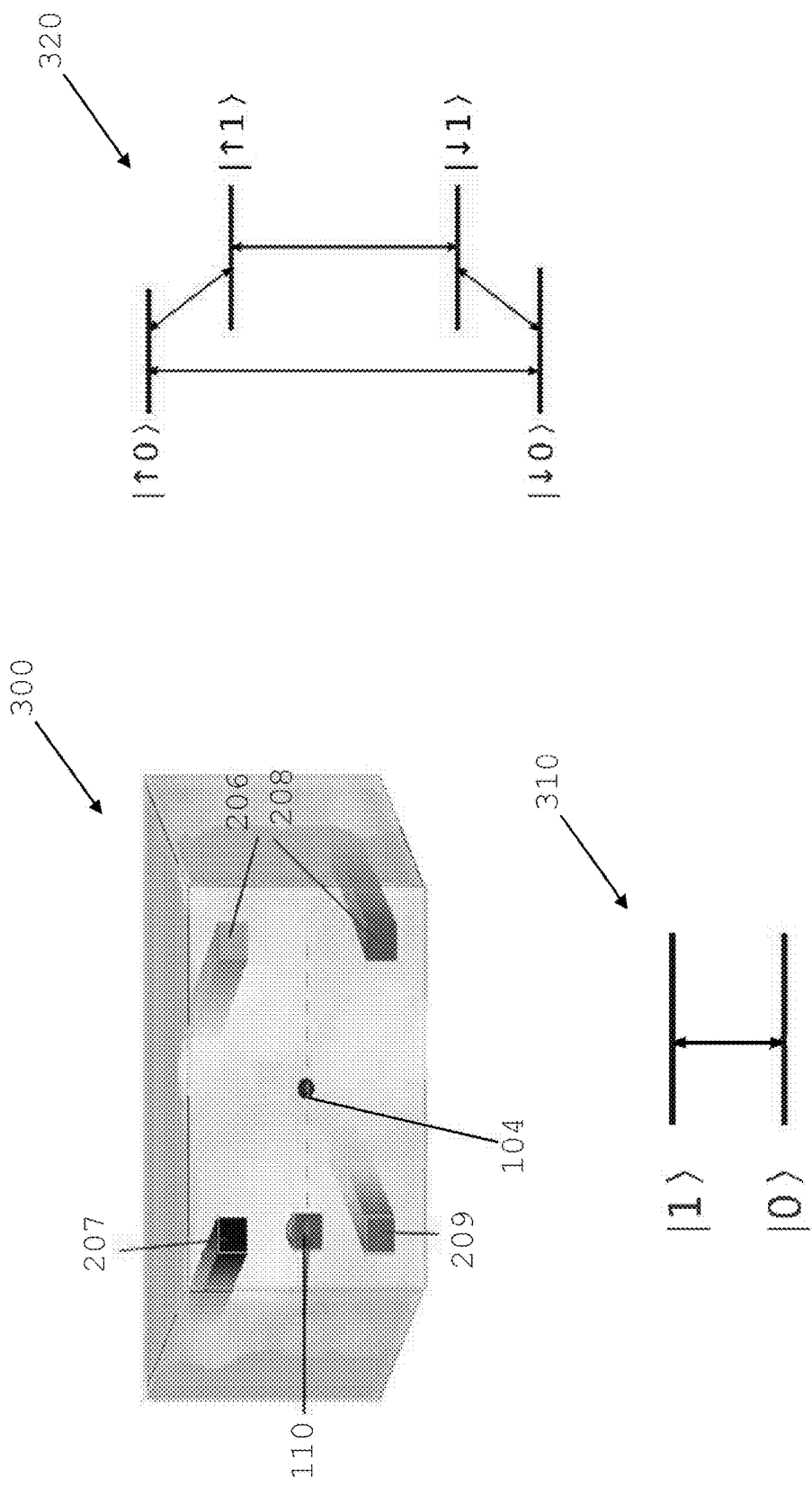

Referring now to FIG. 3, there is shown a further view 300 of a donor atom in a qubit memory state with respective control lines and control island. In this 'memory' state the hyperfine interaction is naturally exactly zero, since no electron is present. Energy diagram 320 shows the energy levels relevant to ESR/NMR control. The four energy levels have four allowed transitions, two RF NMR transitions, and two microwave ESR transitions. Each of these transitions can be individually targeted to perform single qubit rotations and electron-nuclear spin interactions.

By selectively loading electrons on specific donor atoms, quantum gate operations can be selectively and simultaneously performed across the quantum processor architecture.

Loading an electron onto a given donor location, by pulsing the corresponding gates, endows that a donor with a non-zero hyperfine interaction between the nuclear and electron spin immediately after the electron is loaded. This shifts the resonant frequency of the given donor nuclear spin. A given set of qubits can thus be brought independently into resonance with global RF/MW fields to affect a desired single qubit gate. This is a highly uniform digital change in the hyperfine value, and is governed by the donor-island tunneling process, which can be engineered with atomic precision, and characterized in the system set-up phase.

In the memory state the qubit nuclear spin is far off resonance and not affected by the global control fields.

Two qubit gates between nearest neighbour nuclear spin qubits are also controlled by electron load/unload operations. In the absence of bound electrons the interaction between nuclear spins at these separations is negligible. However, when electrons are loaded on adjacent atoms, in addition to any exchange coupling felt by the electrons, the spin-spin dipole interaction increases by a factor of $(g\mu_B/g_n\mu_n)^2 \approx 3 \times 10^6$ effectively switching the inter-qubit interaction on digitally. Two-qubit logic gates can be decomposed into a well-defined series of single qubit and two-qubit interactions in the presence of the global control fields. All gates, initialisation and read-out are therefore ultimately controlled by the unit cell gate-set and can be carried out with a high degree of parallelisation.

In an ionized state the nuclear spins of well-spaced donors in an isotopically pure silicon material have negligible interaction with either electron spins or with nearby donor nuclear spins. As a consequence there is no leakage of qubit information to higher orbital states, and since the donor atom is fixed in space the overall qubit loss, which can severely affect the TQEC threshold, is zero. The T2 time of the nuclear spin is extremely long and has been measured to be 39 minutes. In the qubit memory (idle) state the donors are ionized. In this situation, the nuclear spins precess according to the Zeeman Hamiltonian.

$$H^n_{idle} = -g_n\mu_n B_z Z_n$$

Here $g_n$ is the nuclear g-factor, $\mu_n$ is the nuclear dipole moment, $B_z$ is the applied magnetic field (along the z-axis), and $Z_n$ is the Pauli Z-operator applying to the nuclear spin. In general hereafter the operators X, Y and Z refer to the corresponding Pauli matrices. Sub-scripts e and n refer to electronic and nuclear spins. The energy splitting of the qubit states, of an ionized donor 104 is uniformly $\Delta E_{idle} = 2g_n\mu_n B_z$.

Figure 4:
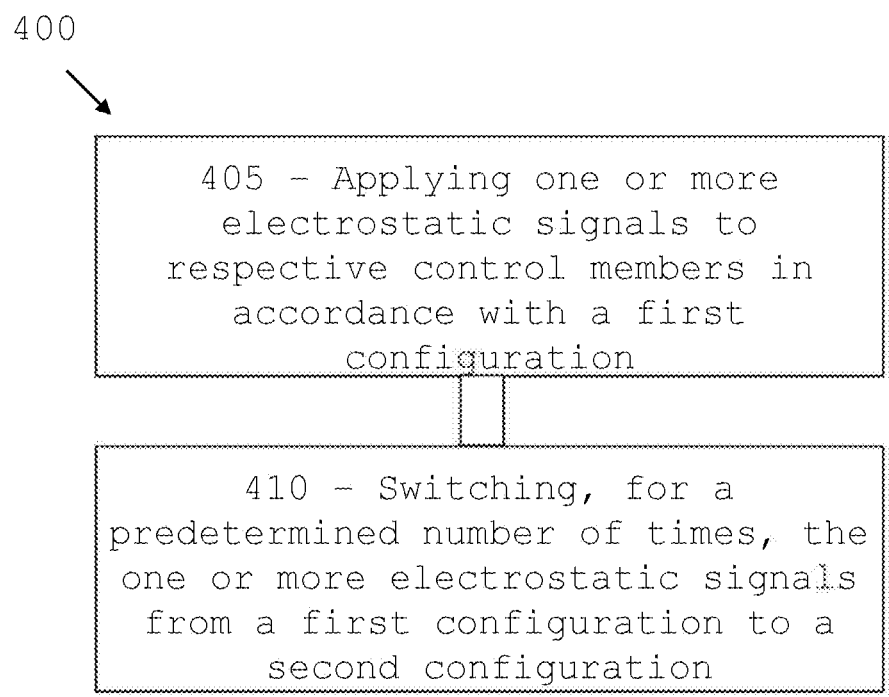
FIG. 4 is a flow diagram illustrating a procedure to load an electron on a donor atom or cluster.
Figure 5:
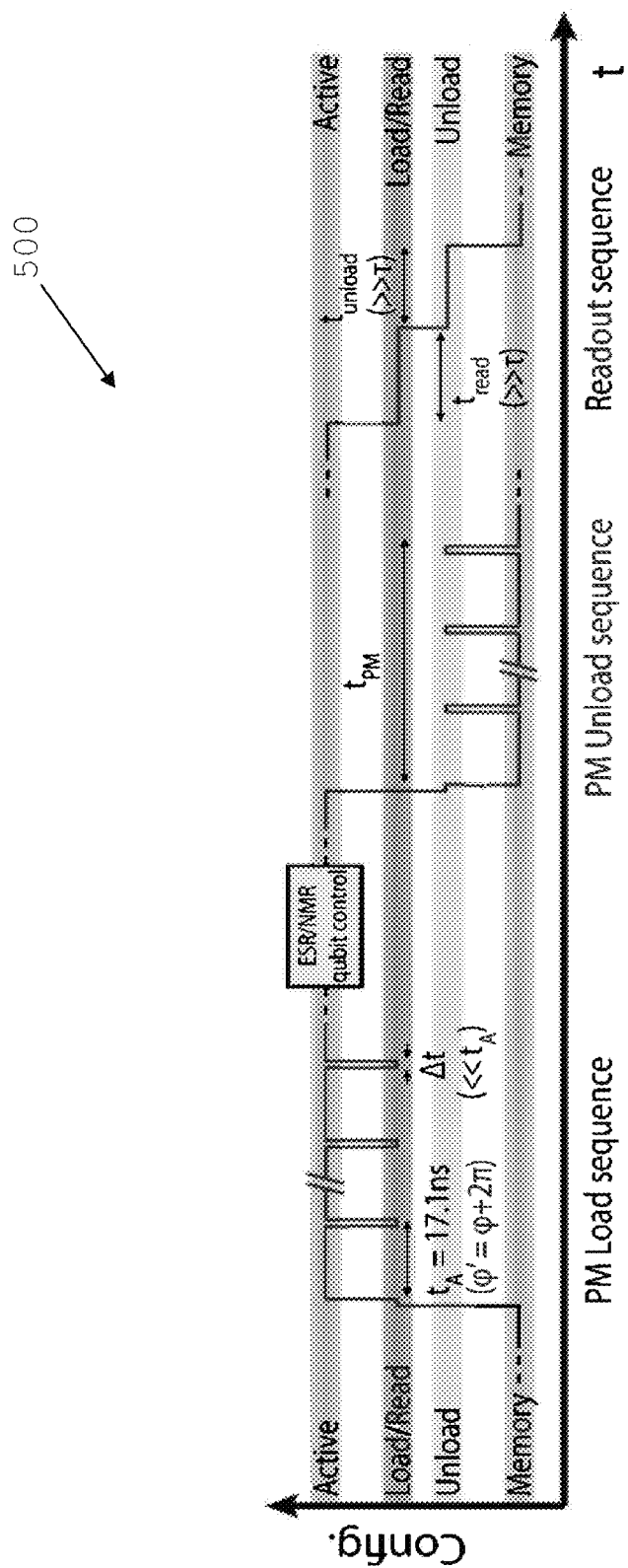
FIG. 5 is a schematic illustration of a series of signals applied to the control lines of the architecture described 3 to load/unload an electron to/from a donor atom or cluster.
Figure 6:
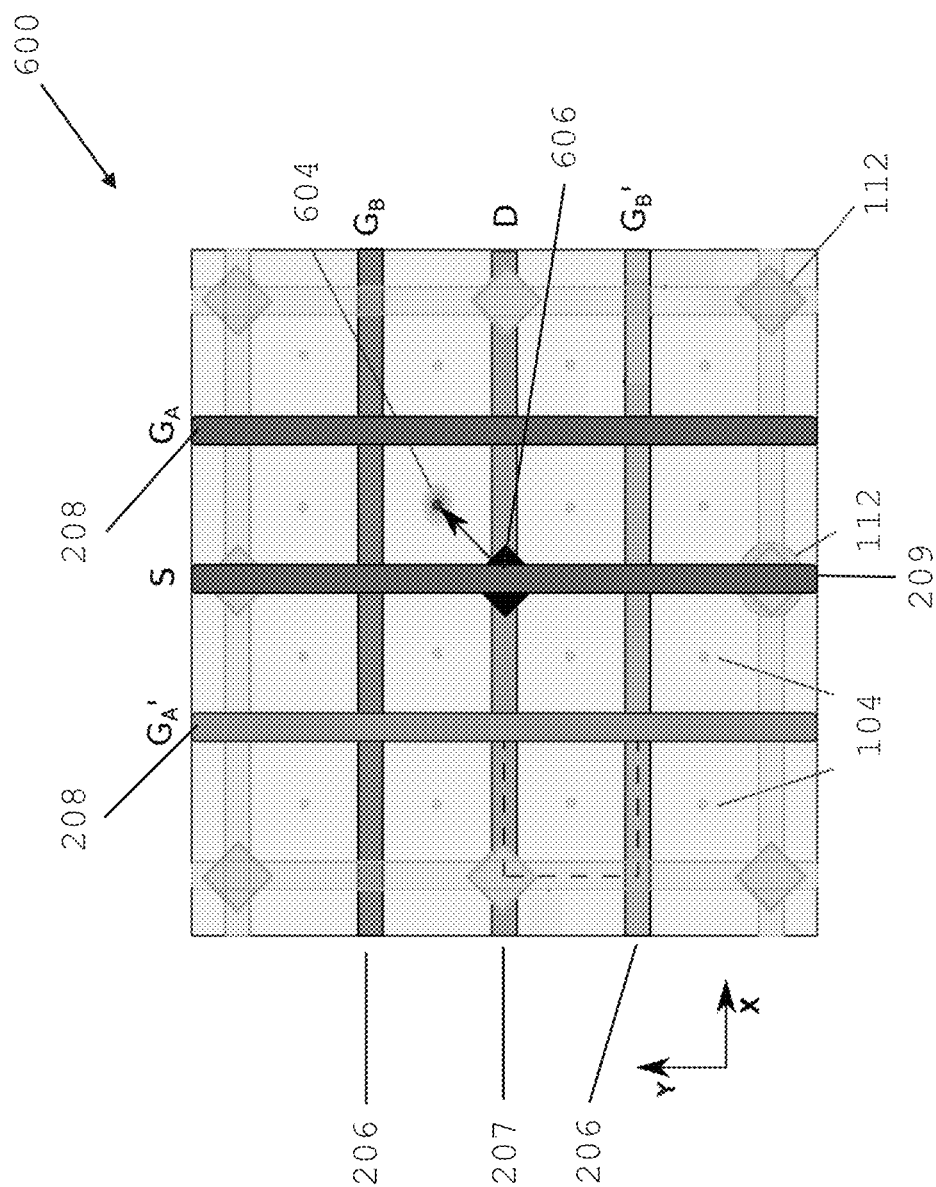
FIG. 6 is a schematic illustration of the operation of the architecture during loading/unloading at a specific donor atom.

Referring now to FIGS. 4 to 6 there are respectively shown a flow diagram listing the necessary steps to load an electron on a donor atom using the architecture described above, a series of electrical signals applied to the control lines used for the loading and a schematic view of the architecture showing the control lines and donor atoms involved in the process.

With donor placement to near single atomic site precision it is expected that the tunneling time between the donor and SET island can be engineered from a range as low as nanoseconds to milliseconds (depending on the islands separation). However, quantum tunneling is a naturally stochastic process. When the electron is present on the donor there is an additional phase accumulation due to the hyperfine interaction. If the precise time at which the electron tunnels to the donor is not known, then the abrupt change in strength of hyperfine leads to a phase accumulation for the nuclear spin, and is a significant source of dephasing on timescales as short as 1 ns.

To overcome this, tunneling at times which do lead to a phase difference between loaded and ionised nuclear spin qubits is prevented. There is a difference in frequency of approximately $f_{diff} = 2A/h$ between the nuclear spin precession frequency of loaded and unloaded nuclear spins. At each period of $1/f_{diff}$ there is a short window when the ionised and loaded nuclear spin quits have no phase difference. If the architecture is controlled to monitor when the electron is energetically allowed to tunnel by applying sufficiently short load pulses on the relevant control gates, synchronous tunneling can be induced in the phase cycle, and the phase error can be mitigated. This is referred to as a semi-deterministic load (SDL) or phase matched (PM) load or unload procedure.

During the phase matched protocol, the system is kept in a 'locked' configuration where no tunneling can occur between load pulses. This can be achieved by suitable voltage bias combined with size engineering of the island and its orbital states. Under these conditions it is not necessary to know exactly when the electron tunneled, only that the load sequence is long enough for the probability of tunneling to be high with respect to the surface code error threshold. A range of couplings between electron spins can be also used, by making use of relevant composite pulses. After the application of the qubit gate sequence, it may be possible to verify that the electron has correctly loaded and that the gate has occurred by measuring the electron spin as an ancilla. In addition, the application of lattice strain can be used to (a) mitigate the variation of the strength of the exchange-interaction caused by interference between the six degenerate valley states and (b) reduce the hyperfine interaction, lessening the stringent control requirements for the SDL pulse sequence.

A control island is provided in proximity of the donor atom to form a potential well which comprises a plurality of energy levels and the energy spacing of the energy levels is such to allow quantum tunneling of electrons with different spins between the donor atom and the potential well. The SDL sequence requires engineered control islands or separate small gate islands controlled by the gate control lines with sufficiently discrete levels compared to $k_B T$ and tunability of $D^0(\downarrow)$ level to between island filled/unfilled levels. The diagrams show these levels: the spin up and spin down measurement configurations, the locked condition for both the loaded and ionised states, and the loading condition for the ionized and already loaded states.

When the electron is loaded the resonance frequency of the nuclear spin changes by a constant (i.e. digital) amount given by the hyperfine interaction A so that the Hamiltonian of a loaded (non-idle) qubit becomes:

$$H_{loaded} = -g_n \mu_n B_z Z_n + g \mu_B B_z Z_e + A \sigma_n \sigma_e$$

The strength of the hyperfine interaction is a constant for P donors in silicon and is given by $A = 8\pi/3 \, g\mu_B B_n Z_n \, |\psi(0)|^2 = 4.2$ mT (4A=117 MHz). This loaded-qubit Hamiltonian can be directly diagonalized in the space of states $|ne\rangle = (|0\uparrow\rangle; |0\downarrow\rangle; |1\uparrow\rangle; |1\downarrow\rangle)$. To first order the corresponding energies are:

$$E_{|0\uparrow\rangle} = g\mu_B B_z - g_n \mu_n B_z + A$$

$$E_{|1\uparrow\rangle} = g\mu_B B_z + g_n \mu_n B_z - A$$

$$E_{|1\downarrow\rangle} = -g\mu_B B_z + g_n \mu_n B_z + A$$

$$E_{|0\downarrow\rangle} = -g\mu_B B_z - g_n \mu_n B_z - A.$$

If electrons are loaded into the spin down $D^0$ state, the targeted nuclear spin qubits have a resonant frequency of $\Delta E_{loaded} = E_{|1\downarrow\rangle} - E_{|0\downarrow\rangle} = 2(g_n \mu_n B_z + A) + O(A^2/\mu_B B)$, detuned from the ionized donors. In order to generate single qubit operations, a resonant magnetic field is applied:

$$H_{AC} = g\mu_B B_{AC}(X_e \cos(\omega t) + Y_e \sin(\omega t)) - g_n \mu_n B_{AC}(X_n \cos(\omega t) + Y_n \sin(\omega t))$$

where ω is the frequency of the applied field, $B_{AC}$ is the strength of the field and $g_n$, $\mu_n$ govern the nuclear spin precession frequency for phosphorus in silicon. A resonant magnetic field, $B_{AC}$, tuned to the radio frequency corresponding to loaded donors, can implement single qubit rotations on specifically targeted nuclear spins. In a similar way, transitions of the electron spins could be controlled through a global resonant microwave field. This oscillating control field can be applied globally, to all electrons and nuclei in the entire computer at one time. Since the spectator (idle) nuclear spin qubits are ionized (P+ donors) and significantly detuned from the resonant frequency of these addressed qubits such that they are therefore not affected by these operations.

To address a specific nuclear spin qubit, an electron is semi-deterministically loaded on each of these donors from the proximate SET islands by applying electric signals 602 and 604 to four nearest neighbour control lines 206 to 209.

Referring now to FIG. 5, there is shown a diagram 500 which illustrates signals applied to control lines 206 to 209 to implement the method of FIG. 400. A semi-deterministically loading and unloading of electrons from the donor atoms 604 can be implemented compensating voltages can be applied to the next-nearest neighbour controls.

To remove a portion of the stochastic nature of the electron tunneling phenomenon from the SET 606 to donor atom 604, at step 405 control lines 206 to 209 are biased in a first configuration, which allows quantum tunneling of the electron. The biasing configuration is maintained for first period of time. There is a given probability that the electron would have tunneled in the first period of time. Control lines 206 to 209 are then switched, step 410, from the first configuration to a second configuration which minimises the probability of tunneling. This switching sequence is performed for a predetermined number of times which is based on the level of confidence required for quantum tunneling.

In diagram 500, signals are schematic representations of the actual signal which would be applied to control lines 206 to 209.

The number of switching cycles can be predetermined based on the level of confidence required for tunneling by the architecture. A higher level of confidence allows a lower probability of incurring an error. However, the architecture described allows for correction in case an error occurs. On the other hand, increasing the number of cycles above a certain threshold may degrade coherent quantum operation by lengthening the overall gate time, during which time decoherence can occur. The first (loading/unloading) period of time 502 is shorter than the second period of time and, in the case of predominant hyperfine interaction, is in the range of 0.1 ns and 0.5 ns. The second period of time (interaction) is selected so that the nuclear spin of the donor undergoes a relative phase shift of $2\pi$ or multiples thereof to minimise the error introduced by the induced de-phasing of the qubits. The second period of time is between 8 ns and 40 ns, in the case of predominant hyperfine interaction. Other time periods may be used in case of a different type or strength of the interaction.

Although electron and nuclear spin dephasing is present, the dominant source of error arises from the induced dephasing due to the loading and unloading of the electron spin from the donor. Single qubit π pulses were simulated in the presence of nuclear and electron dephasing. In the ideal case, without considering loading error, these gates also take a time of approximately t≈21 µs, and have an error from decoherence and pulsing errors as little as $5\times10^{-5}$. Arbitrary angle rotations around two independent axes allow the ability to perform any single qubit rotation, with a similar level of error. However, when loading is considered (which includes both the dephasing due to loading an electron and the probability of not loading an electron), a single qubit gate has an error of approximately $2\times10^{-4}$, and a time of approximately 1.1 ms, both of which are dominated by the electron loading and unloading process.

Referring now to FIG. 7(a), there is schematically shown the location of the required bias points on a charging diagram corresponding to memory (idle), active, load, unload and readout configurations. A load/control/unload/read sequence is shown in FIG. 5 in which voltages are pulsed to only allow tunneling between SET islands and donors at times which are phase locked to the hyperfine frequency to prevent unknown phase accumulation on the nuclear spin. FIG. 7(b) shows schematics of the energy levels of donor, SET island and S/D lines for each case: the memory (idle), load/read, unload and active configurations. Dotted lines indicate the SET transition energies when an electron is present on the donor, and solid lines indicate transition energies when the donor is ionized.

Figure 8:
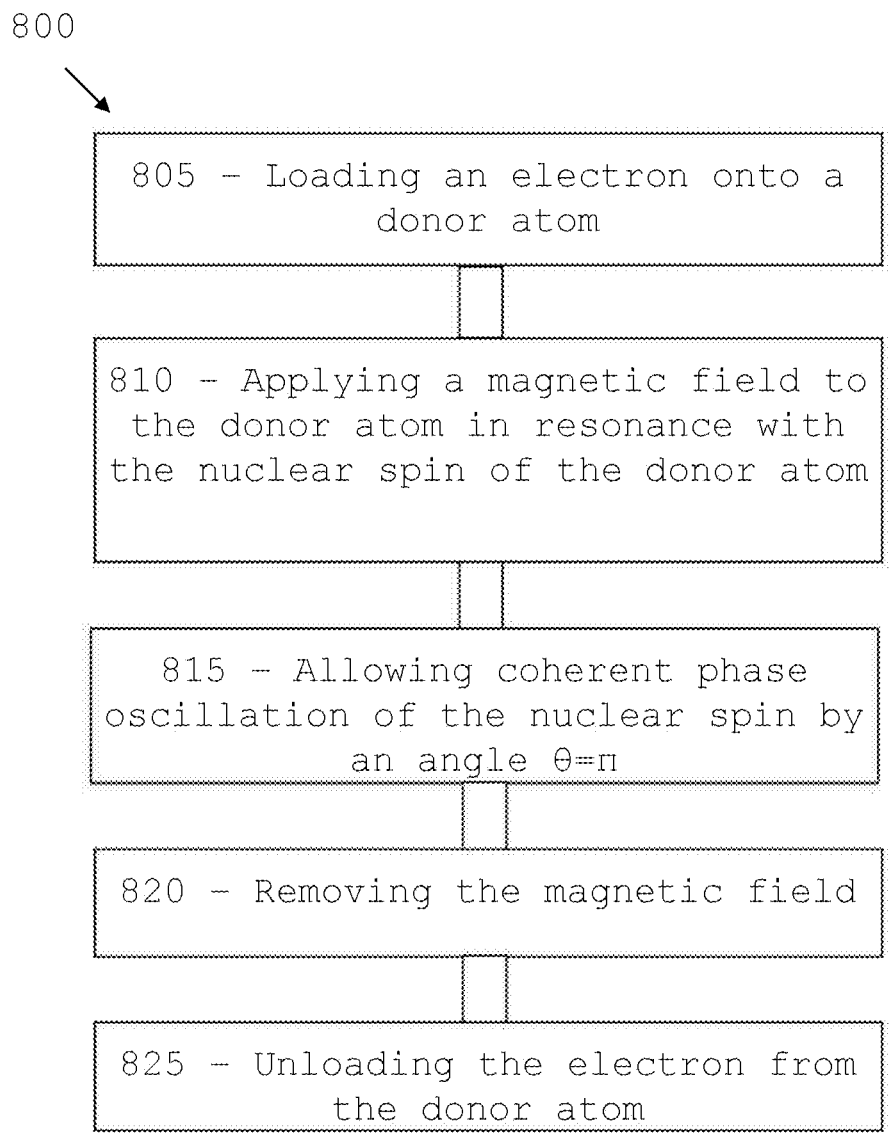
FIG. 8 is a flow-diagram illustrating a procedure to perform a quantum X gate on the architecture described

Referring now to FIG. 8, there is shown a flow-diagram 800 outlining a series of steps which can be undertaken to perform a quantum X gate on a single qubit on the architecture described above. The gate can be performed as follows:
loading an electron onto a donor atom (step 805);
applying an electromagnetic field to the donor atom in resonance with the nuclear spin of the donor atom (step 810);
allowing coherent rotation of the nuclear spin by an angle θ=π (step 815);
removing the electromagnetic field (step 820); and
unloading the electron from the donor atom (step 825).

During step 825 the spin state of the electron may be measured to verify its orientation and determine possible errors in the X gate operation. The X gate operation can be performed, potentially at the same time, on a plurality of donor atoms 104 distributed across the architecture and pre-selected by loading of electrons.

For typical values, and strength of AC field of $B_{AC}$≈1 mT the corresponding π rotation time is about 20 µs. Arbitrary angle rotations of the nuclear spin around the y-axis may also be achieved with a RF AC field π/2 out of phase to x-axis rotations. Using combinations of these two arbitrary angle rotations around two orthogonal axes, any single qubit rotation of the nuclear spin may be achieved using this load-global control paradigm. This includes the ability to implement robust control pulses such as BB1 to absorb control and/or fabrication errors, and decoupling pulses such as the CPMG sequence.

Architecture 100 is also capable of implementing two qubit quantum gates, such as the CNOT gate between physical qubits. Two qubit gates are formed when electrons are loaded onto neighbouring donors 104 allowing the effective interaction between qubits to increase by six orders of magnitude or more. The electronic spin-spin interaction can be based on either direct dipole or exchange spin-spin interactions, depending on the overall dimensions and placement of gate structures. In the embodiment described, dipole-mediated gates are considered. This is the dominant form of interaction when donor atoms 104 have a separation of d=35 nm. At smaller spacing, the exchange interaction would dominate. Provided the interaction strength falls below 10 MHz the same pulse sequence applies to form an exchange interaction CNOT based gate.

The dipole-dipole interaction is highly uniform in comparison to the exchange interaction which has been predicted to oscillate owing to interference between the six degenerate valley states present in silicon (which can be made more uniform using strained silicon). This means the strength of the dipole interaction is relatively robust with respect to donor placement. The dipole-dipole interaction is also less likely to fluctuate in response to electronic noise in the device. The dipole-dipole interaction between two neighbouring donor electronic spins, labelled i, and j, is given by:

$$H_{int} = \frac{\mu_0}{4\pi} \frac{h}{2\pi} \gamma_e^2 \left( \frac{\sigma_i \cdot \sigma_j - 3(\hat{r} \cdot \sigma_i)(\hat{r} \cdot \sigma_j)}{R^3} \right)$$

Here R is the distance between donors, r-hat is the unit vector describing the orientation of $r_i$-$r_j$·$\gamma_e$ describes the magnetic moment of the two electron spins. The total Hamiltonian is composed of each of these terms, $$H = H_{int} + \sum_i H^{(i)}_{loaded} + H^{(i)}_{AC}$$

Figure 9:
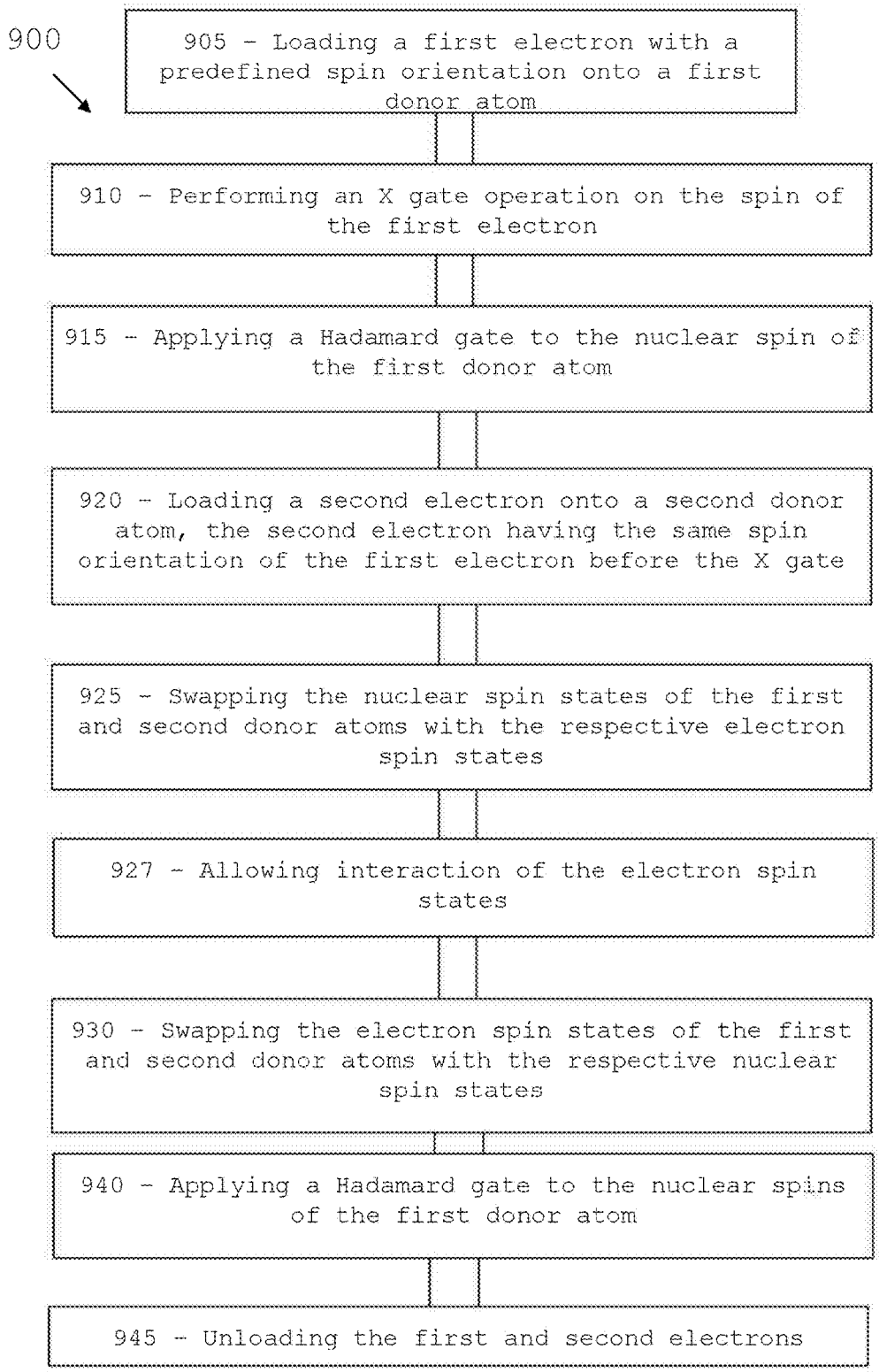
FIG. 9 is a flow-diagram illustrating a procedure to perform a CNOT gate on the architecture described.

Referring now to FIG. 9, there is shown a flow-diagram 900 comprising a series of steps that can be undertaken to perform a CNOT gate between a selected set of control and target qubits as follows:
loading a first electron with a predefined spin orientation onto a first donor atom (the 'target' qubit of the CNOT operation, step 905);
performing an 180 degree X rotation operation on the spin of the first electron (step 910);
applying a Hadamard gate to the nuclear spin of the second donor atom (step 915);
loading a second electron onto a second donor atom, the second electron having the same spin orientation of the first electron before the X rotation (the 'control' qubit of the CNOT operation, step 920);
applying a decoupling pulse over the duration of the loading of the second electron (step 922);
swapping the nuclear spin states of the first and second donor atoms with the respective electron spin states (step 925);
allowing interaction of the electron spin states (step 927) and applying at least two spin-echo pi-pulses on the electronic spins using a global electromagnetic field during the electron-electron interaction;
swapping the electron spin states of the first and second donor atoms with the respective nuclear spin states (step 930);
applying a Hadamard gate to the nuclear spins of the first donor atom (step 940); and
unloading the first and second electrons (step 945).

Figure 10:
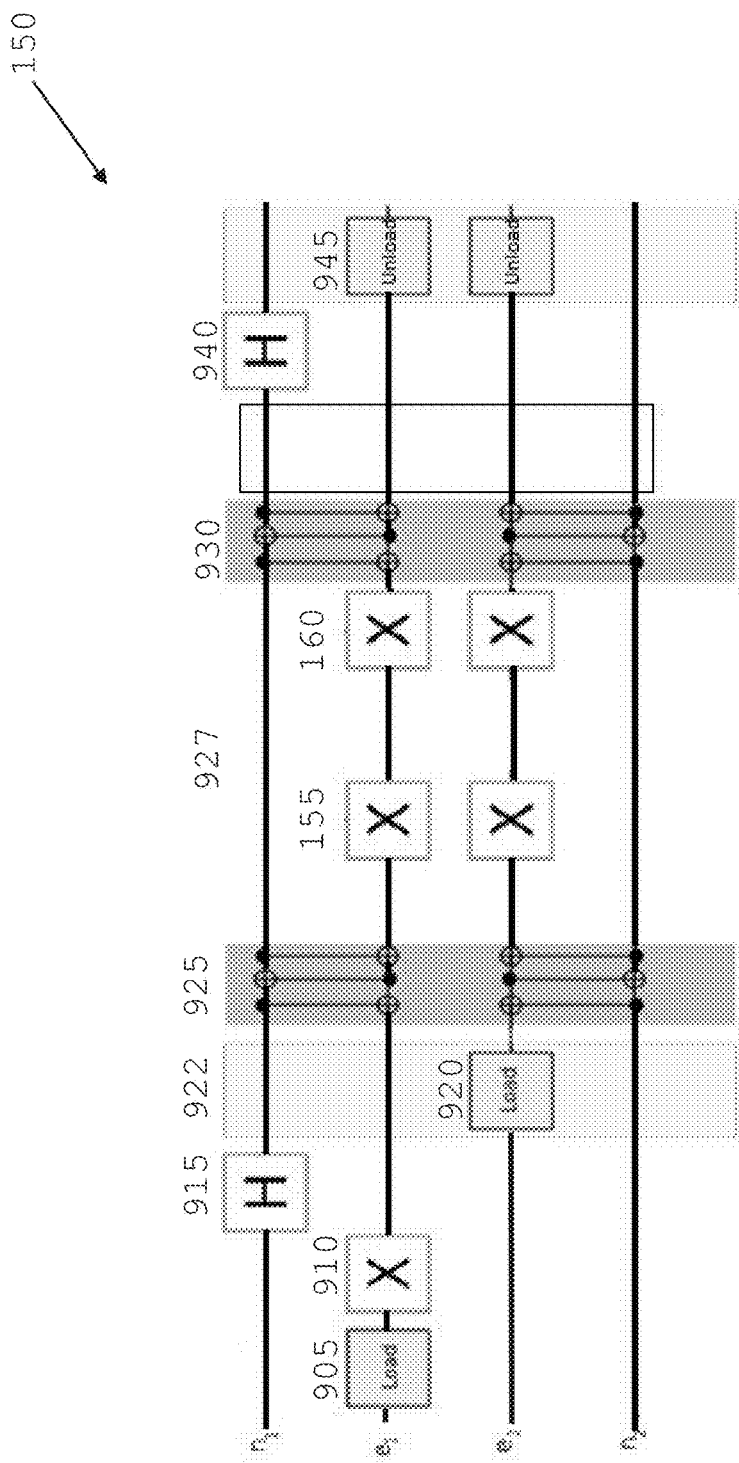
FIG. 10 is a quantum gate diagram representing a CNOT quantum gate.

Referring now to FIG. 10, there is shown a quantum gate diagram 150 showing the steps of diagram 900 performed in the electron and nuclear spins of two different donor atoms. Diagram 150 also shows that during the step 927 a global electron spin echo or a refocusing sequence can be applied 155 and 160 to the electron spin states to minimise error. At step 927, a sufficient interaction between the spin states is generally allowed such that a collective phase flip of n, or odd multiple thereof, is acquired by the electron spin states.

The spin state of the first and the second electrons may be measured while the electrons are unloaded. During the measuring procedure the spin orientation of the first and the second electrons can be verified to detect possible errors of the CNOT gate.

Steps 925 and 930 are performed by applying an electromagnetic field to the architecture. Additional control signals are also applied in some cases to correct for variations in donor pair interaction strength, fabrication or material imperfections. During step 920, a decoupling ESR pulse 922 may be applied to prevent the two adjacent electron spins from flipping with each other.

The staggered load of the control qubit followed by the target qubits is carried out in sequential steps on nest-neighbouring qubit cells. Critically the loading of the control electrons and its subsequent ESR X-gate makes it possible to distinguish the control and target electrons, giving them different resonance frequencies. Having significantly different resonance frequencies makes it possible to apply the secular approximation to the interaction (which can therefore be approximated as an Ising interaction). This simplifies the required operations, and also allows both dipole-dipole and exchange based gates to operate in identical fashion.

The CNOT also allows for the inclusion of an interaction correction protocol to compensate for small (a-priori unknown) variations in the natural spin-spin interaction due to placement precision at the lattice site level. In particular, BB1 based schemes provide an applicable composite pulse, implementing a high fidelity CNOT gate even in the presence of variations in the strength of interaction. After both electrons are loaded, the qubit states which are stored in the nuclear spins are swapped with the electron spins. The electron spins interact to form the gate 930. Interspersing relatively fast ESR X-gates during the time in which the electron interact, refocuses any electron phase accumulated through residual inhomogeneous effects, while commuting with the interaction operator. This guarantees that the overall CNOT gate fidelity is governed by $T_2(e)$ rather than the much shorter $T^*_2(e)$. Once the electron-electron interaction is complete the data qubit states are swapped back from the electron spins to the nuclear spins. The electrons are then unloaded.

Readout is performed one donor spin at a time. At this stage the state of the electron spins could also be read-out via the SET to provide information about the veracity of the gate to aid the error correction procedure. If an electron did not load correctly, or an error has occurred during the operation, then a spin up electron will not be measured. In this case, is has been measured that an error has occurred during the gate operation, and the possible errors leading to the non-detection of a spin up ancilla can be calculated. The most likely case is that an electron did not load, in which case the gate is designed to perform the identity. If such an error is detected, the operation can be repeated in order to perform a correct CNOT gate, or the information can be passed to the surface code, where the error can be corrected. This type of heralded error is less detrimental to the coherence of a quantum error correction than a regular, unheralded error.

Figures 11A, 11B:
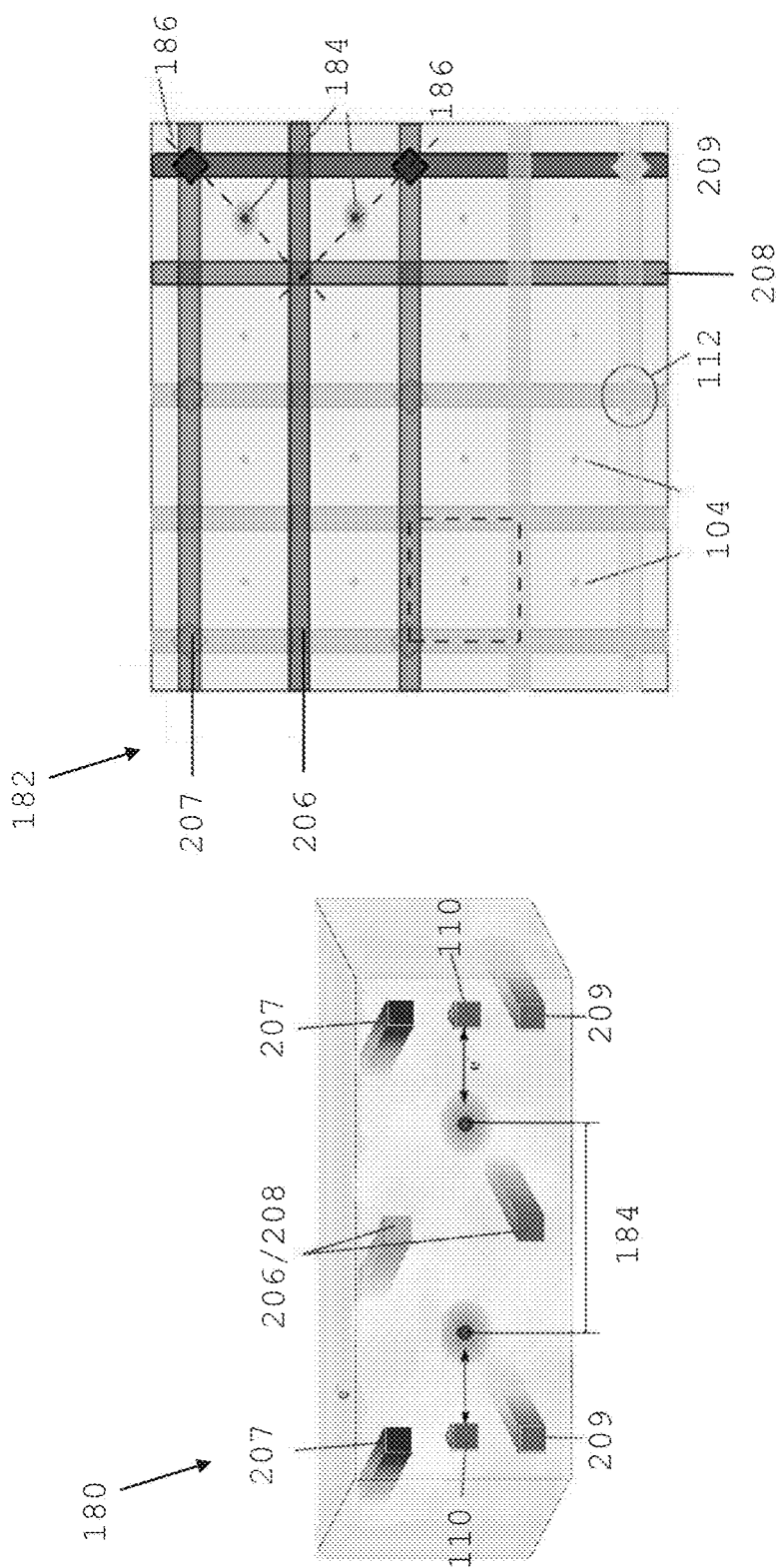
FIGS. 11(a) and 11(b) are schematic illustrations of a section of the architecture described suitable to perform a CNOT gate.

Referring now to FIG. 11(*a*), there is shown a cut-through 180 of the architecture, showing the loaded donors 184 and corresponding control lines 206 to 209 and control islands 110. FIG. 11(*b*) shows control lines 206 to 209 which are (separately) biased to allow tunneling to the two neighbouring donor locations 184.

One of the key requirements of the surface code for a UQC, critical to capture a high threshold, is the ability to perform as many operations in parallel using the 2D qubit architecture. The architecture presented in this paper is ideal for this task. The combination of global RF/ESR fields for gate control together with the criss-cross gate array allows a high degree of control, and in particular, parallel operation. In order to implement the operations required for syndrome extraction and logical qubit encoding, logical qubit operations and error correction in the surface code (or related topological codes), it is necessary to load and unload electrons in a variety of geometric patterns. The geometric layout constrains which donors can be loaded and unloaded at each step, although not every pattern can be created in a single step. Based on the capacitance simulations shown in the previous it is expected that all required geometric patterns for the implementation of topological quantum error correction can be created in parallel using only a small number of steps. While simple geometric patterns, such as lines and rectangles, can be created in one or two steps. More complex patterns can be created by combining these simple geometric patterns sequentially to load electrons and construct more complex regions and patterns. The simplest example of a loading pattern is to load a single electron at a specified location.

Figure 12:
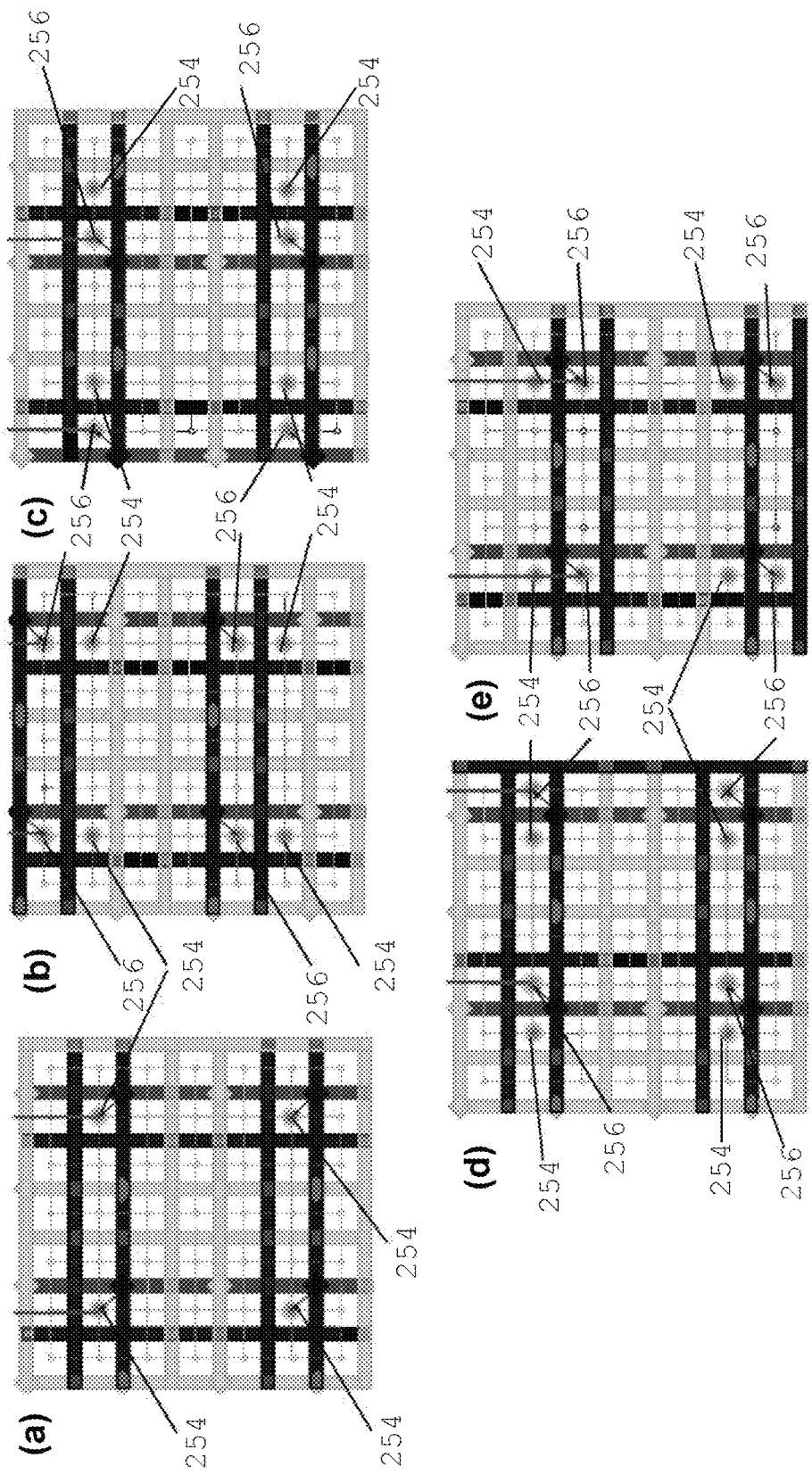
FIG. 12 shows a series of schematic representations of the architecture during loading/unloading for syndrome extraction at specific atoms across the qubit matrix.

Referring now to FIG. 12, in (a), there is shown a loading configuration of an electron into a single donor location 254 through the respective SET. Voltages are applied to vertical and horizontal control lines. Two neighbouring control lines (dark) are controlled in order to compensate and prevent unwanted tunneling of electrons into other donor locations.

Referring now to FIG. 12, in (b) to (e), there is shown a typical sequence of loading configurations used to implement a surface code syndrome measurement.

The figures show ancilla qubits 254 and data qubits 256. Ancilla 254 are loaded to syndrome qubits, and the corresponding locations required for that syndrome measurement, namely north (b), east (c), west (d) and south (e) of a given syndrome qubit. In each subfigure, greyed or coloured control lines show the application of a voltage bias applied in order to load and unload electrons from the corresponding donors 254 and 256.

The cardinal directions are used to indicate relative positions of donor atoms or qubits disposed across the matrix.

Vertical horizontal lines shown represent the control lines. Coloured vertical and horizontal lines represent the set of control lines to be biased. Donors are shown as dots, located between rows and columns. The location of SET islands are shown as filled rectangles at the appropriate intersection of source and drain control lines.

Figure 13:
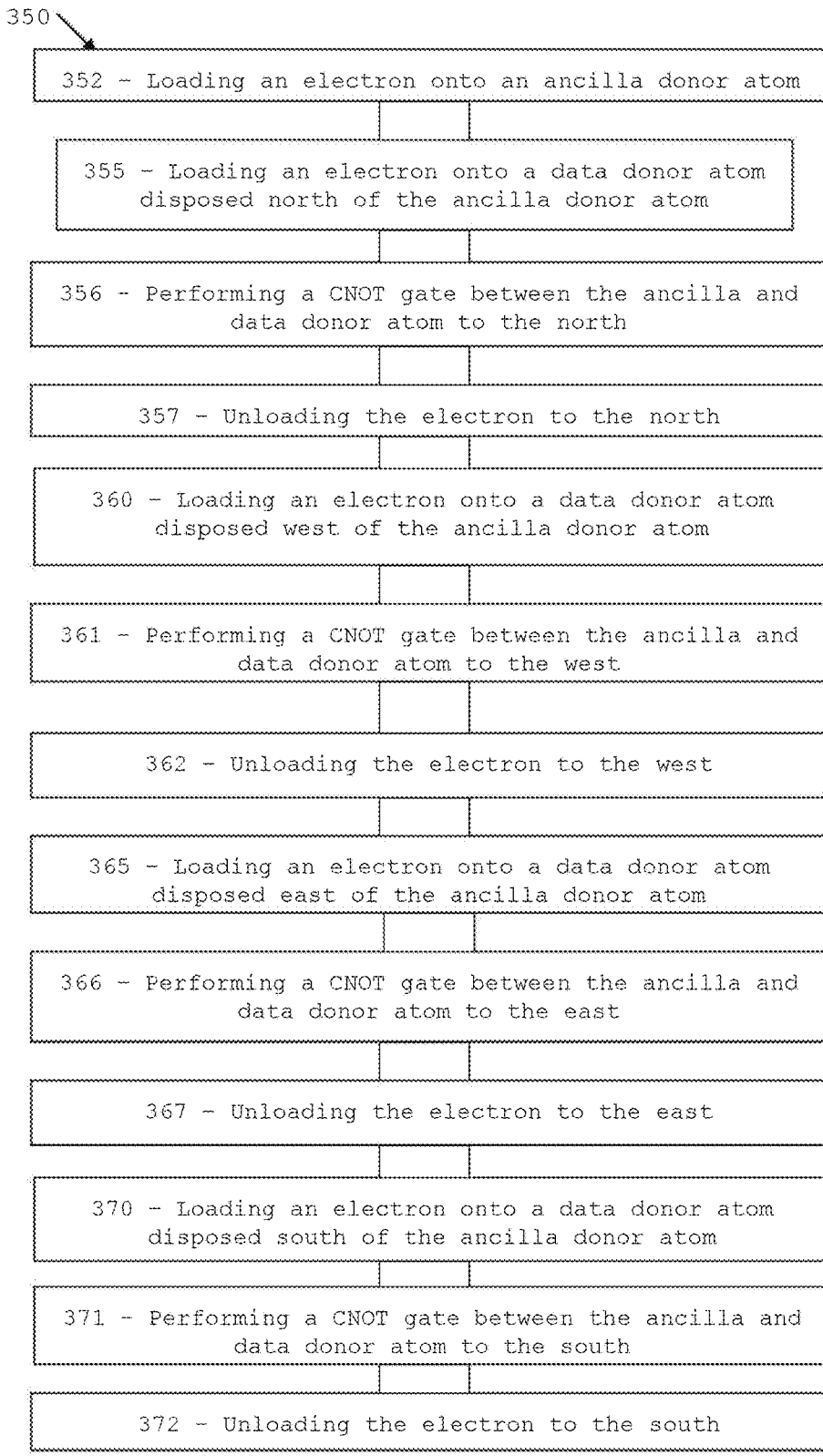
FIG. 13 is a flow-diagram illustrating a procedure to perform a syndrome extraction.

Referring now to FIG. 13, there is shown a flow-diagram 350 comprising a series of steps that can be undertaken to perform a syndrome extraction as illustrated in FIG. 12. The steps are as follows:

loading an electron onto an ancilla donor atom and performing a quantum rotation on the ancilla qubit depending on the type of stabiliser measurement (X or Z) to be carried out for error correction (352);

loading an electron onto a data donor atom disposed north of the ancilla donor atom (step 355);

performing a CNOT gate between the ancilla and data donor atom to the north (step 356);

unloading the electron to the north (step 357);

loading an electron onto a data donor atom disposed west of the ancilla donor atom (step 360);

performing a CNOT gate between the ancilla and data donor atom to the west (step 361);

unloading the electron to the west (step 362);
loading an electron onto a data donor atom disposed east of the ancilla donor atom (step 365);
performing a CNOT gate between the ancilla and data donor atom to the east (step 366);
unloading the electron to the east (step 367);
loading an electron onto a data donor atom disposed south of the ancilla donor atom (step 370);
performing a CNOT gate between the ancilla and data donor atom to the south (step 371); and
unloading the electron to the south and performing a second quantum rotation on the ancilla qubit depending on the type of stabiliser measurement (X or Z) to be carried out for error correction and performing readout of the ancilla qubit (step 372).

As illustrated in FIG. 12, the steps of loading electrons on ancilla donor atoms can be performed simultaneously on a plurality of donor atoms across the architecture by applying appropriate control voltages to the control lines.

By applying the correct voltage set to these lines an electron can be induced to tunnel from the island to the respective donor, as discussed with reference to FIGS. 1 and 2. In only one case, at the intersection of the control lines to which bias voltages have been applied can electrons tunnel onto (or from) the donor. Other combinations of voltages applied at different donor atoms do not allow tunneling. In FIG. 12, in (a), for example, tunneling only takes place in a single location and only a single electron is loaded into the matrix. However, this method is not restricted to loading and unloading only individual electrons. Any geometric shape can be obtained by applying the correct voltages. In FIG. 12, in (b) to (e), several combinations of electrons are all brought into resonance with the island. Many simple geometric patterns can be created in this way. For example, rectangles and many repeating patterns can be created by applying different combinations of cell-bias sets. Not every pattern can be created in this way in a single step. However, by using the regular patterns as primitives, much more complex patterns can be created using a sequence of loading steps. Particular patterns of gates may be required for the implementation of syndrome measurements for the surface code. These gates and sequences are highly repetitive, and interactions required for the measurement of syndromes can be systematically reproduced and performed in parallel. This series of syndrome measurements requires the application of CNOT gates to the ancilla north, west, east, and south of the data qubit.

This naturally forms the basis for syndrome extraction required in the various quantum error correction protocols. If a defect is required the corresponding measurements can be neglected by unloading the corresponding electrons. In order to extract all syndromes, the series of syndrome measurements is then repeated, transposed to the right by two positions, up by two positions, and up-right by two positions. The sequence may not be performed on qubits too closely space, because otherwise electrons which are not intended to be coupled will couple together via the dipole-dipole interaction, degrading gate fidelity. This sequence takes four times longer than the canonical single step simultaneous syndrome measurement. In total then, if the number of individual parallel operations required for full syndrome extraction is $N_{steps}$. The corresponding surface code error threshold is estimated to be $p_{th} \approx 1\%$.

Referring now to FIG. 14, there are shown simulations results of electrostatic gate control for qubit addressing. FIG. 14(a) shows a pair of source (S) and drain (D) leads crossing an SET are negatively biased to plunge the loading potentials of its four nearest donors. The symmetry in the four donor potentials is broken by a detuning combination of (GA, GB, GA', GB') that allow a single donor to be selected for electron loading.

Loading an electron to a specific qubit requires the application of a positive bias voltage to a pair of crossing control lines such that the added electrostatic energy due to just one gate is insufficient to access the $D^0$ state, but the combination is enough. This ensures that no other qubits along a row/column are erroneously loaded. The multiplexed layout means that for each intersecting pair of gates GA and GB there are still 4 donor atoms that are seen as equivalent by this gate combination. In FIG. 14(a), the intersection of GA and GB is surrounded by 4 equidistant donors. To load an electron onto just one of these without affecting the others requires compensating voltages on other nearby gates. For instance, the pair S and D can be simultaneously biased with a fraction of the primary gate voltage to lower the loading potential for the target yellow donor below the other three. At the same time, application of a negative voltage to next-nearest pairs GA and GB and S and D raises the transition potential higher for surrounding non-target donors. While using the source and drain lines as secondary gates will result in large bias voltages at non-target SETs, the resultant flow of current is easily identified and can be ignored. For the gates pace maps shown, the compensation factors are 1, 0.6 and (0.6) for target gates, nearest neighbour and next nearest neighbour lines respectively.

FIG. 14(b) is a 3D wireframe model used for Fastcap capacitance computation. The spatial extent of all entities is dilated by 2 nm in all directions consistent with the Bohr radius in silicon.

FIG. 14(c) is a charge stability analysis. Increasingly negative $V_{plunge}=V_s=V_D$ loads additional electrons to the SET (lines I and II). At $V_{plunge}=-15$ mV, $V_{tilt}=0$ an electron is loaded in any one of four donors (III). A voltage $V_{tilt}$ along the x-axis separates the loading conditions for the donors. In this case ($V_{tilt}=2V_{GA}=-2V_{GA0}=V_{GB}=-V_{GB0}$) the top right donor is loaded preferentially. Spin selective load and readout occurs at the intersection of donor and SET lines at IV, V etc. FIG. 14(d) shows gate coordinates where only the top right donor is occupied and all others surrounding it are ionised. The blue hashed region indicates coordinates where additionally its south neighbour donor is loaded as for a two qubit gate. Greyed out areas indicate that other targeted donors are loaded. FIG. 14(e) shows a non-shared SET case (Type II). A two qubit gate on the top pair of donors requires adding a plunge voltage to the neighbouring drain $V_{dualplunge}=V_S=V_D=2.2$ $V_{D'}$. This allows sequential and selective loading of just those two donors.

Since only nearest and next-to-nearest gates are required for unambiguous qubit selection, and more distant gates have negligible electrostatic coupling, large-scale parallel operation in this architecture is a matter of repeating the gate bias pattern on every fourth gate/lead line horizontally and vertically. This will operate on 1 in every 8 qubit donors simultaneously, since every other donor is an ancilla in the surface code. In parallel operation, the readout and gate confirmation signals from multiple SETs will be superimposed together, many qubit signals per source/drain line. Provided the bandwidth of the SET sensor is larger than the tunneling on/off rate, it will be possible to temporally correlate discrete changes in current through one source and one drain to unambiguously identify the particular qubit location from which the signal originated. If two electrons tunnel at similar times, it is possible they cannot be temporally resolved, meaning the location of the electron cannot be resolved. This can be remedied either by ignoring the measurement (and allowing error correction to correct any resulting error), or repeating the measurement. When repeating the measurement, it becomes exponentially unlikely that the same two locations give a temporal collision. Therefore, few measurements would be needed for even extremely large grids of qubits. Our quantum computer design is predicated on the ability to load and remove a single electron from a given target donor qubit. The ability to load, unload, read an individual electron from a donor has been demonstrated in several experiments.

In the quantum processor architecture disclosed herein a primary form of decoherence is due to dephasing related to phosphorus in silicon. Each qubit interacts with an environment, primary made of a small number of residual $^{29}$Si nuclear spins. A perfect isotopically pure environment cannot be achieved in practice, and fluctuations in the nuclear spin bath lead to dephasing of the phosphorus donor electrons and nuclei. Each gate can be simulated in the presence of electron and nuclear spin dephasing. Although electron and nuclear spin dephasing is present, the dominant source of error arises from the induced dephasing due to the loading and unloading of the electron spin from the donor. Single qubit π pulses are simulated in the presence of nuclear and electron dephasing. In the ideal case, without considering loading error, these gates also take a time of approximately t≈21 μs, and have an error from decoherence and pulsing errors as little as $5\times10^{-5}$. Arbitrary angle rotations around two independent axes allow the ability to perform any single qubit rotation, with a similar level of error. However, when loading is considered (which includes both the dephasing due to loading an electron and the probability of not loading an electron), a single qubit gate has an error of approximately $2\times10^{-4}$, and a time of approximately 1.1 ms, both of which are dominated by the electron loading and unloading process.

Figure 15B:
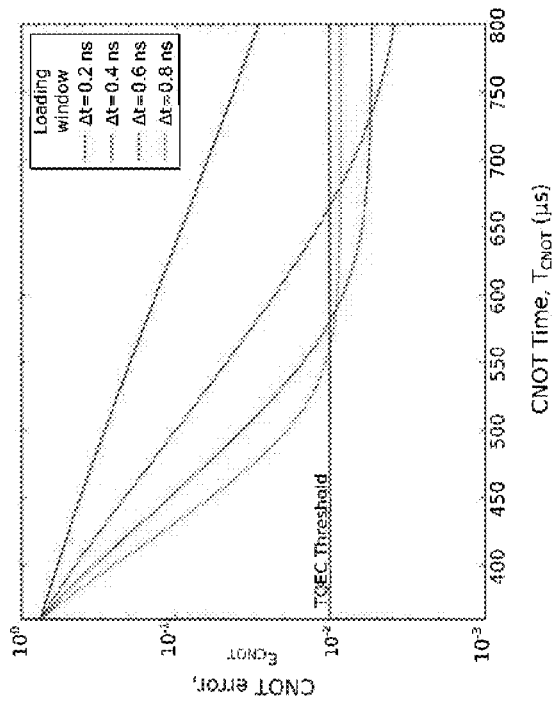
FIGS. 15(a) and 15(b) shows simulation results of phase matched (PM) qubit activation and the CNOT gate.
Figure 15A:
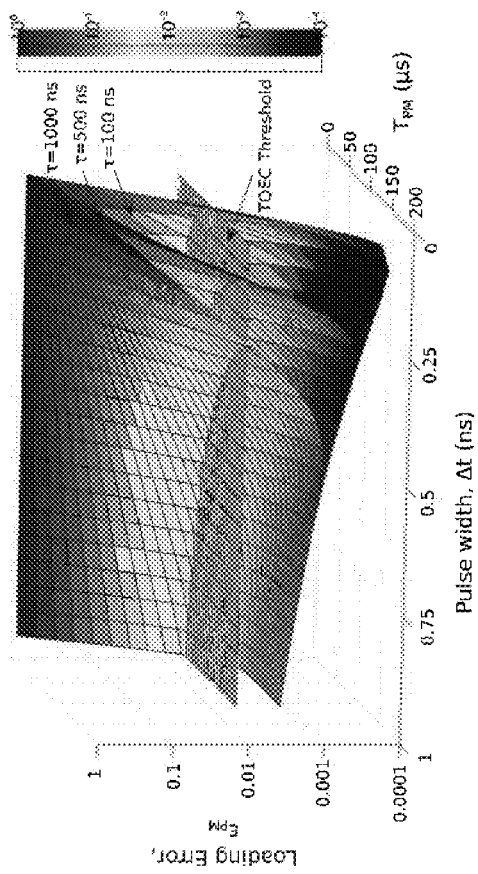

Referring now to FIG. 15, there are shown simulation results of phase matched (PM) qubit activation and the CNOT gate. FIG. 15(a) shows the total PM loading error with respect to the surface code threshold, including residual qubit dephasing, as a function of PM pulse window, Δt, and overall pulse train length $T_{PM}$ for a range of SET-donor tunneling rates τ=100, 500, 1000 ns. FIG. 15(b) shows CNOT gate error and total operation time (including PM loading and unloading operations) for PM pulse window widths Δt=0.2, 0.4, 0.6 and 0.8 ns (fixed parameters: τ=500 ns, 30 nm qubit spacing, and $T_2(e)$=2s).

In the presence of dephasing represented by $T^e{}_2$ and $T^n{}_2$ this gate has a total fidelity of approximately 99.97%. This fidelity is dominated by the dephasing imposed by tunneling the electron onto and off the nucleus, and during time required for the interaction between electrons.

For a load pulse width of $\Delta t_{load}$ and time $\Delta t_{lock}$=1/A between pulses, and assuming on/off exponential tunneling probabilities characterized by an average tunneling times $\tau_{on,off}$, the probability of loading on to the donor, after N load pulses is:

$$Pr_{on}(N) = 1 - e^{-\Delta t_{lock}/\tau_{off}}(1 - e^{-\Delta t_{load}/\tau_{on}}) \times \frac{\left(1 - e^{-\Delta t_{load}/\tau_{on}} e^{-\Delta t_{lock}/\tau_{off}}\right)^N}{\left(1 - e^{-\Delta t_{load}/\tau_{on}} e^{-\Delta t_{lock}/\tau_{off}}\right)}$$

By demanding an overall phase error of $10^{-4}$ or less, a $\Delta t_{load}$ of 0.27 is required. With tunneling times of $\tau_{on}$=1 μs and $\tau_{off}$>>$\tau_{on}$ and a loading error of $10^{-4}$ or the total SDL sequence length is 0.53 ms, commensurate with the dipole based CNOT gate. For both single and two qubit gates, when an electron fails to load, the gate applied performs no operation on the nuclear spin qubits. The correct loading of electron spins may be varied after each operation, by measuring the state of the electron spin. Flipped to be spin up, the presence of an electron is detectable via spin readout performed at the SET. In principle, this means that the correct operation of gates can be checked via this readout mechanism, and repeated if the gate has not been correctly implemented. If there are r rounds of repetition, and the original probability of not correctly loading an electron is p, then the probability of not correctly loading after r rounds is reduced to pr, which the threshold error of an error correction code will be reduced to approximately $p_{th}$/r. If not used in this repetitive fashion, this extra information about the errors introduced by gates can supplement syndrome measurement. Not measuring an electron where expected heralds an error in a gate, an error which is far easier to correct than a stochastic error. In contrast to single qubit gates, $T^2$ dephasing has a significant impact on the much longer duration CNOT gate. The CNOT gate has been simulated assuming a spacing of 35 nm where dipole-dipole interaction dominates over the exchange interaction. The overall fidelity of the CNOT gate, for a variety of electronic dephasing rates is shown in FIG. 15. While at a spacing of 35 nm gates can be constructed to make use of the dipole-dipole interaction, at closer spacing the exchange interaction between donors will become significant. In principle, gates can still be constructed accurately provided the ratio of the hyperfine strength (A) to the exchange interaction strength (J) remains high. The two interactions have equal strength at approximately 15 nm spacing. Making use of the exchange interaction (by building smaller spacing) would allow two qubit gates at up to 10 MHz operation timescales.

Figure 16:
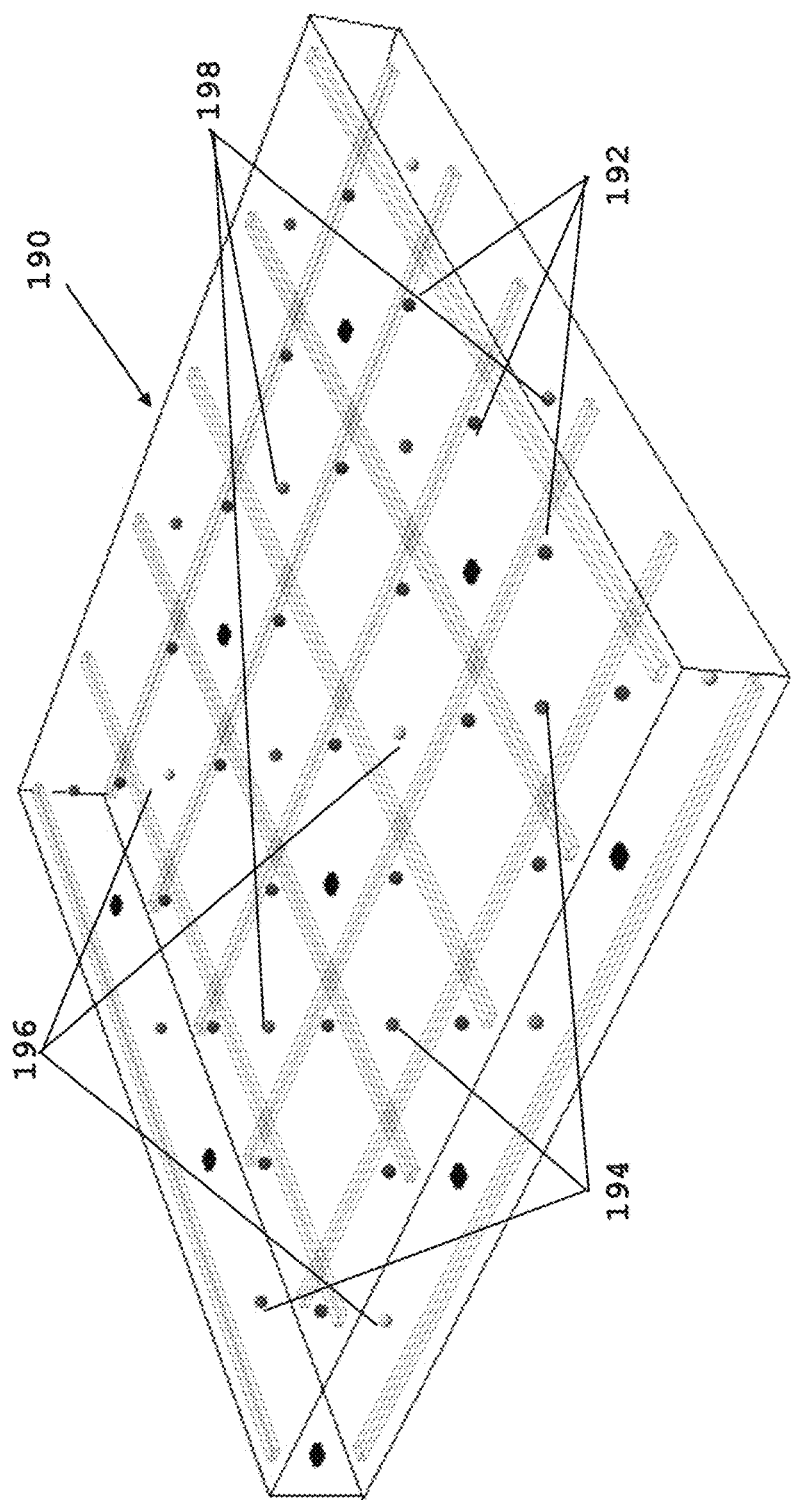
FIG. 16 shows an alternative architecture of the quantum processor in accordance with embodiments.

Referring now to FIG. 16, there is shown an alternative embodiment of a quantum processor architecture. Architecture 190 is operable using similar principles to the architecture of FIG. 1. However, in architecture 190 coupling between donors is enhanced by intermediate coupling qubits 192. These couple each data qubit 194 to two X syndrome ancilla qubits 196 and two Z syndrome ancilla qubits 198. The additional coupling qubits provide improved coupling capabilities in respect to the architecture of FIG. 1, and a different method of operation not requiring phase matched loading.

The operations described above form a base of primitive operations for performing the surface code on the disclosed architecture. Combinations of these primitive operations, performed on the same architecture, allow performing high level quantum error correction tasks. For example, using the primitive operations discuss in sequences 'lines of operations' can be performed on the architecture addressing lines of qubits across the architecture. A larger 'logical' qubit can hence be defined. The logical qubit is defined on a large set of physical qubits and their ancilla.

Quantum gates on these logical qubits can also be performed by applying primitive operations to the qubits forming the logical qubit. Although the sequence of the specific primitive operations may be complex, the overall procedures performed on the logical qubits are the ones described herein with reference to qubits implemented on single phosphorus donor atoms. For example, a CNOT gate between two logical qubits may result in a very complex series of operations performed on many qubits of the architecture. The described technology disclosed herein is not limited to the architecture and the implementation of the primitive operations, but encompasses high level quantum error corrected computation performed on the logical qubits introduced above.

The architecture described in the embodiments above provides a new pathway to scalable quantum computing using silicon donor qubits. However the described technology is not limited to this, the simplified control model may be of use for other solid-state systems where the number and complexity of accommodating control lines is a significant bottleneck for scale-up.

Techniques such as the matched loading procedure can be applied to different types of applications and quantum structures and is not limited to the architecture described herein.

Although the term 'matrix' has been used to describe qubits arranged in rows and columns, the described technology is not limited to that. In some embodiments, the qubits of the quantum processor may be arranged in different patterns and not be aligned in conventional rows and columns.

The term "comprising" (and its grammatical variations) as used herein are used in the inclusive sense of "having" or "including" and not in the sense of "consisting only of".

The quantum processor described herein uses quantum mechanics to perform computation. The processor may be used for a range of applications and provide enhanced computation performance, these applications include: encryption and decryption of information, advanced chemistry simulation, optimization, machine learning, pattern recognition, anomaly detection, financial analysis and validation amongst others. Further, in certain implementations, the invention may be used in communicating and processing image or video information, audio or data communication, and other similar implementations in the communications technology.

It will be appreciated by persons skilled in the art that numerous variations and/or modifications may be made to the inventive technology as shown in the specific embodiments without departing from the spirit or scope of the invention as broadly described. The present embodiments are, therefore, to be considered in all respects as illustrative and not restrictive.

The claims are as follows:

1. A quantum processor comprising:
    a plurality of qubit elements disposed in a two-dimensional matrix arrangement, wherein a quantum state of the qubit elements is encoded in the nuclear or electron spin of one or more donor atoms embedded in a semiconducting structure; and
    a control structure comprising:
        a first set of elongated control members, arranged in a first plane above a plane comprising the donor atoms;
        a second set of elongated control members, arranged in a second plane below a plane comprising the donor atoms;
        a plurality of control elements disposed on a plane between the first and the second plane, each control element forming a single electron transistor with a respective control member of the first set and a respective control member of the second set,
    wherein each control member is arranged to control a plurality of qubit elements disposed along a row or a column of the two-dimensional matrix to perform topological quantum error corrected computation.

2. The processor of claim 1 wherein the control structure is controllable to simultaneously interact with a plurality of qubit elements disposed in pattern of qubits.

3. The processor of claim 1 wherein the control structure is controllable to simultaneously load or unload electrons to or from a plurality of donor atoms.

4. The processor of claim 1 wherein a plurality of donor atoms is arranged to facilitate electromagnetic coupling between one or more of the qubit elements.

5. The processor of claim 1 wherein:
    the control members of the first set are parallel to each other and the control members of the second set are parallel to each other; and
    the control members of the first set are disposed transversally to the control members of the second set to form a plurality of intersections where control members of different sets overlap in the direction perpendicular to the plane comprising the donor atoms.

6. The processor of claim 5 wherein each control element is arranged to interact with a plurality of neighbouring donor atoms.

7. A method for loading or unloading an electron to or from a donor atom of a quantum processor, the method comprising the step of:
    switching, for a predetermined number of times, one or more electrostatic signals applied to respective control members from a first configuration to a second configuration, wherein the first configuration of signals is such to prevent quantum tunnelling of the electron to or from the donor atom and the second configuration of signals is such to permit quantum tunnelling of the electron to or from the donor atom.

8. The method of claim 7 wherein the predetermined number of times is selected such that quantum tunnelling of the electron occurs with a predetermined level of confidence.

9. The method of claim 7 wherein a control element is provided in proximity of the donor atom to form a potential well about the donor atom, the potential well providing a plurality of energy levels and the energy spacing of the energy levels being such to allow quantum tunnelling of electrons with different spins between the donor atom and the potential well.

10. A method of operating a quantum Pauli X gate in a quantum processor comprising a plurality of qubit elements encoded in the nuclear or electron spin of one or more donor atoms embedded in a semiconducting structure, the method comprising the steps of:
    applying a magnetic field to the donor atoms with a loaded electron, the magnetic field being in resonance with a nuclear spin of the donor atoms;
    allowing coherent rotation of the nuclear spin by an angle θ; and
    removing the magnetic field.

11. A method of operating a CNOT quantum gate in a quantum processor comprising a plurality of qubit elements encoded in the nuclear or electron spin of one or more donor atoms embedded in a semiconducting structure, the method comprising the steps of:
    loading a first electron with a predefined spin orientation onto a first donor atom;
    performing an X gate operation on the spin of the first electron;
    applying a Hadamard gate to a nuclear spin of the first donor atom;

loading a second electron onto a second donor atom, the second electron having the same spin orientation as the first electron before the X gate is performed on the first electron;

swapping the nuclear spin states of the first and second donor atoms with the respective electron spin states;

allowing interaction of the electron spin states;

swapping the electron spin states of the first and second donor atoms with the respective nuclear spin states;

applying a Hadamard gate to the nuclear spins of the first donor atom; and unloading the first and second electrons.

12. The method of claim 11 wherein the method further comprises the step of, during the step of unloading the first and the second electrons, measuring the spins state of the first and the second electrons and verifying the spin orientation of the first and the second electrons to detect possible errors of the CNOT gate.

13. A method of performing readout of a quantum state of a plurality of qubit elements in a quantum processor comprising the plurality of qubit elements encoded in the nuclear or electron spin of one or more donor atoms embedded in a semiconducting structure, the method comprising the steps of:

simultaneously controlling a plurality of control members arranged to interact with the donor atoms associated with the plurality of qubit elements;

measuring electrical signals propagated on the plurality of control members; and performing one or more time-correlation operations using one or more of the measured electrical signals to determine associate readout information to qubit elements allowing for simultaneous readout.

14. A method for implementing topological quantum error corrected computation in a quantum processor comprising a plurality of qubit elements encoded in the nuclear or electron spin of one or more donor atoms embedded in a semiconducting structure, wherein a plurality of data qubit elements are encoded in a first set of the donor atoms and a plurality of ancilla qubit elements are encoded in a second set of the donor atoms, wherein in each row or column of the matrix data qubits are alternated with ancilla qubits to facilitate quantum correction; and the control method comprises the steps of:

loading an electron onto an ancilla donor atom;

loading an electron onto a data donor atom disposed north of the ancilla donor atom;

performing a CNOT gate between the ancilla and data donor atom to the north;

unloading the electron to the north;

loading an electron onto a data donor atom disposed west of the ancilla donor atom;

performing a CNOT gate between the ancilla and data donor atom to the west;

unloading the electron to the west;

loading an electron onto a data donor atom disposed east of the ancilla donor atom;

performing a CNOT gate between the ancilla and data donor atom to the east;

unloading the electron to the east;

loading an electron onto a data donor atom disposed south of the ancilla donor atom;

performing a CNOT gate between the ancilla and data donor atom to the south; and unloading the electron to the south; and wherein the steps of loading electrons on ancilla/data donor atoms are performed simultaneously on a plurality of donor atoms across the two-dimensional matrix.

15. The method of claim 10 wherein at least one of the steps of loading or unloading electrons is performed using a method comprising switching, for a predetermined number of times, one or more electrostatic signals applied to respective control members from a first configuration to a second configuration, wherein the first configuration of signals is such to prevent quantum tunnelling of the electron to or from the donor atom and the second configuration of signals is such to permit quantum tunnelling of the electron to or from the donor atom.

16. A semiconductor quantum processor comprising:

a plurality of donor atoms arranged in a two-dimensional matrix;

a plurality of data qubit elements encoded in a first set of the donor atoms;

a plurality of ancilla qubit elements encoded in a second set of the donor atoms;

wherein in each row or column of the matrix data qubits are alternated with ancilla qubits to facilitate quantum correction; and a plurality of logical data qubits and logical ancilla qubits are encoded across the matrix, each logical data qubit and logical ancilla qubit being encoded on a plurality of data qubit elements and ancilla qubit elements qubit elements.

* * * * *